US011921179B2

(12) United States Patent
Wang et al.

(10) Patent No.: US 11,921,179 B2
(45) Date of Patent: *Mar. 5, 2024

(54) METHODS AND SYSTEMS FOR SPIN-ECHO TRAIN IMAGING USING SPIRAL RINGS WITH RETRACED TRAJECTORIES

(71) Applicant: University of Virginia Patent Foundation, Charlottesville, VA (US)

(72) Inventors: Zhixing Wang, Charlottesville, VA (US); Steven P. Allen, Charlottesville, VA (US); Xue Feng, Zion Crossroads, VA (US); John P. Mugler, III, Charlottesville, VA (US); Craig H. Meyer, Charlottesville, VA (US)

( * ) Notice: Subject to any disclaimer, the term of this patent is extended or adjusted under 35 U.S.C. 154(b) by 91 days.

This patent is subject to a terminal disclaimer.

(21) Appl. No.: 17/732,181

(22) Filed: Apr. 28, 2022

(65) Prior Publication Data
US 2022/0373627 A1    Nov. 24, 2022

Related U.S. Application Data

(60) Provisional application No. 63/324,970, filed on Mar. 29, 2022, provisional application No. 63/180,939, filed on Apr. 28, 2021.

(51) Int. Cl.
*G01R 33/48* (2006.01)
*G01R 33/54* (2006.01)
*G01R 33/56* (2006.01)
*G01R 33/561* (2006.01)
*G01R 33/565* (2006.01)

(52) U.S. Cl.
CPC ......... *G01R 33/482* (2013.01); *G01R 33/543* (2013.01); *G01R 33/5608* (2013.01); *G01R 33/5617* (2013.01); *G01R 33/56509* (2013.01)

(58) Field of Classification Search
None
See application file for complete search history.

(56) References Cited

U.S. PATENT DOCUMENTS

| 2014/0152304 | A1* | 6/2014 | Fielden | ............... | G01R 33/565 |
| | | | | | 324/309 |
| 2022/0229136 | A1* | 7/2022 | Kannengiesser | ...... | G01R 33/50 |
| 2022/0357416 | A1* | 11/2022 | Mugler, III | ...... | G01R 33/56581 |

* cited by examiner

*Primary Examiner* — Rodney E Fuller
(74) *Attorney, Agent, or Firm* — Troutman Pepper Hamilton Sanders LLP

(57) ABSTRACT

Methods, computing devices, and magnetic resonance imaging systems that improve image quality in turbo spiral echo (TSE) imaging are disclosed. With this technology, a TSE pulse sequence is generated that includes a series of radio frequency (RF) refocusing pulses to produce a corresponding series of nuclear magnetic resonance (NMR) spin echo signals. A gradient waveform including a plurality of segments is generated. The plurality of segments collectively comprise a spiral ring retraced in-out trajectory. During an interval adjacent to each of the series of RF refocusing pulses, a first gradient pulse is generated according to the gradient waveform. The first gradient pulses encode the NMR spin echo signals. An image is then constructed from digitized samples of the NMR spin echo signals obtained based at least in part on the encoding.

20 Claims, 17 Drawing Sheets
(10 of 17 Drawing Sheet(s) Filed in Color)

METHODS AND SYSTEMS FOR SPIN-ECHO TRAIN IMAGING USING SPIRAL RINGS WITH RETRACED TRAJECTORIES

This application claims the benefit of U.S. Provisional Patent Application Ser. No. 63/180,939, filed on Apr. 28, 2021, and U.S. Provisional Patent Application Ser. No. 63/324,970, filed on Mar. 29, 2022, each of which is hereby incorporated by reference in its entirety.

This Invention was made with government support under EB028773 awarded by the National Institutes of Health. The government has certain rights in the invention.

FIELD

This technology generally relates to magnetic resonance imaging (MRI) and, more particularly, to methods for improved image quality using spiral rings with retraced trajectories.

BACKGROUND

When a substance such as human tissue is subjected to a uniform magnetic field (e.g., polarizing field. $B_0$, the individual magnetic moments of the spins in the tissue attempt to align with this polarizing field and process about it at their characteristic Larmor frequency. If the substance is subjected to a magnetic field (e.g., excitation field $B_1$ which is in the x-y plane and which is near the Larmor frequency, the net aligned moment, $M_z$, may be rotated, or "tipped", into the x-y plane to produce a net transverse magnetic moment $M_1$. A signal is emitted by the excited spins, and after the excitation field $B_1$ is terminated, this signal may be received and processed to form an image.

When utilizing these signals to produce images, magnetic field gradient(s) (e.g., $G_x$, $G_y$, and/or $G_z$) are employed for spatial encoding. Typically, the region to be imaged is scanned by a sequence of measurement cycles in which these gradient(s) vary according to the particular localization method being used. The resulting set of received signals are digitized and processed to reconstruct the image using a reconstruction technique.

One method for producing images efficiently is known as turbo spin echo (TSE) imaging, which is also referred to as fast spin echo (FSE) imaging and is an implementation of a Rapid Acquisition with Relaxation Enhancement (RARE) technique that has replaced the conventional Spin-Echo (SE) technique for T2-weighted imaging due to its faster acquisition time.

Although a two-dimensional (2D) Cartesian TSE sequence is one of the standard methods for T2-weighted imaging, the high specific absorption rate (SAR) induced by a large number of refocusing RF pulses limits its use at high magnetic fields. The long RF pulse train may produce T2-decay blurring and may also alter the image contrast compared to the conventional SE. Another limitation of Cartesian TSE is a relatively long scan time attributed to the low sampling efficiency, typically taking minutes for images with sub-millimeter spatial resolution, which may induce motion artifacts from patient motion.

Compared to Cartesian sampling, spiral imaging covers k-space more efficiently via a higher average k-space velocity, thereby reducing total scan time and/or improving the signal-to-noise ratio (SNR). Spiral imaging also has the advantage of reduced sensitivity to motion artifacts, and flow artifacts are often minimal and isotropic. Spiral acquisitions have been incorporated into a 2D TSE signal generation module via two strategies: (1) an interleaved, rotated spiral-arm segmentation and (2) an annular ring segmentation.

The first strategy offers advantages over conventional Cartesian TSE in terms of SNR efficiency, improved image contrast, and reduced SAR. However, this method requires a double-encoding strategy and a signal-demodulation method to mitigate swirl-like artifacts due to T2-decay induced signal variation, extending the scan time. The annular ring segmentation strategy splits long spiral trajectories into several annular segments, with the benefit of reduced T2-decay artifacts by converting the T2-dependent signal modulation into a k-space apodizing filter.

A 2D spiral ring TSE technique has been developed for dual-contrast T2-weighted imaging at 1.5T using a spiral ring segmentation and a shared-view acquisition. The results demonstrated that ring segmentation leads to a smoothed T2-dependent weighting of signal amplitudes across k-space and thus benign artifact behavior. One key advantage of this annular ring segmentation approach, compared to the interleaved, rotated spiral-arm segmentation strategy, is that there is no need for the double-encoding, thus resulting in a shorter scan time.

However, there are challenges associated with the annular ring segmentation technique, such as residual T2-decay blurring and off-resonance induced signal loss. In addition, early echoes are typically discarded to achieve the desired T2-weighting, resulting in reduced scan efficiency.

SUMMARY

In one aspect, a method for turbo spiral echo (TSE) imaging of a subject is disclosed that implemented by one or more computing devices. The method includes generating a TSE pulse sequence that includes a series of radio frequency (RF) refocusing pulses to produce a corresponding series of nuclear magnetic resonance (NMR) spin echo signals. A gradient waveform including a plurality of segments is generated. The plurality of segments collectively comprise a spiral ring retraced in-out trajectory. During an interval adjacent to each of the series of RF refocusing pulses, a first gradient pulse is generated according to the gradient waveform. The first gradient pulses encode the NMR spin echo signals. An image is then constructed from generated digitized samples of the NMR spin echo signals obtained based at least in part on the encoding.

In another aspect, a computing device is disclosed that includes memory including programmed instructions stored thereon and one or more processors configured to execute the stored programmed instructions to facilitate TSE imaging of a subject. In particular, a TSE pulse sequence is produced to generate a corresponding series of NMR spin echo signals. The TSE pulse sequence includes a series of RF refocusing pulses. First and second gradient waveforms each including a plurality of segments collectively comprising a spiral ring retraced in-out trajectory are generated. During an interval adjacent to each of the series of RF refocusing pulses a pair of gradient pulses are generated each according to one of the first or second gradient waveforms. The pair of gradient pulses provides an encoding of the NMR spin echo signals. An image is then constructed from digitized samples of the NMR spin echo signals obtained based in part on the encoding.

In yet another aspect, a magnetic resonance imaging (MRI) system is disclosed that includes a control sequencer coupled to a gradient subsystem that includes gradient amplifiers and gradient coils and an MRI subsystem that includes a static z-axis magnet and one or more RF coils. The MRI system includes a data acquisition and display (DADC) device that includes memory including programmed instructions stored thereon and one or more processors configured to execute the stored programmed instructions to facilitate TSE imaging of a subject. In particular, first and second gradient waveforms are generate each including a plurality of segments collectively comprising a spiral ring retraced in-out trajectory. The control sequencer is instructed to communicate with the MRI subsystem to produce a TSE pulse sequence to generate a corresponding series of NMR spin echo signals. The TSE pulse sequence includes a series of RF refocusing pulses. The control sequencer is further instructed to communicate with the gradient subsystem to generate during an interval adjacent to each of the series of RF refocusing pulses a pair of gradient pulses each according to one of the first or second gradient waveforms. An image is then constructed from digitized samples of the NMR spin echo signals.

In some examples, the technology disclosed herein provides a sampling approach of annular spiral rings with retraced in-out segments for gradient waveforms that improves MRI image quality, increases SNR, mitigates T2-decay induced artifacts, and self-corrects moderate off-resonance while maintaining the target echo time and causing no scan time penalty. The disclosed technology also corrects for k-space trajectory infidelity and off-resonance effects and includes a model-based k-space estimation and semiautomatic off-resonance correction approach that minimizes effects of k-space trajectory infidelity and $B_0$ inhomogeneity, respectively.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1A:
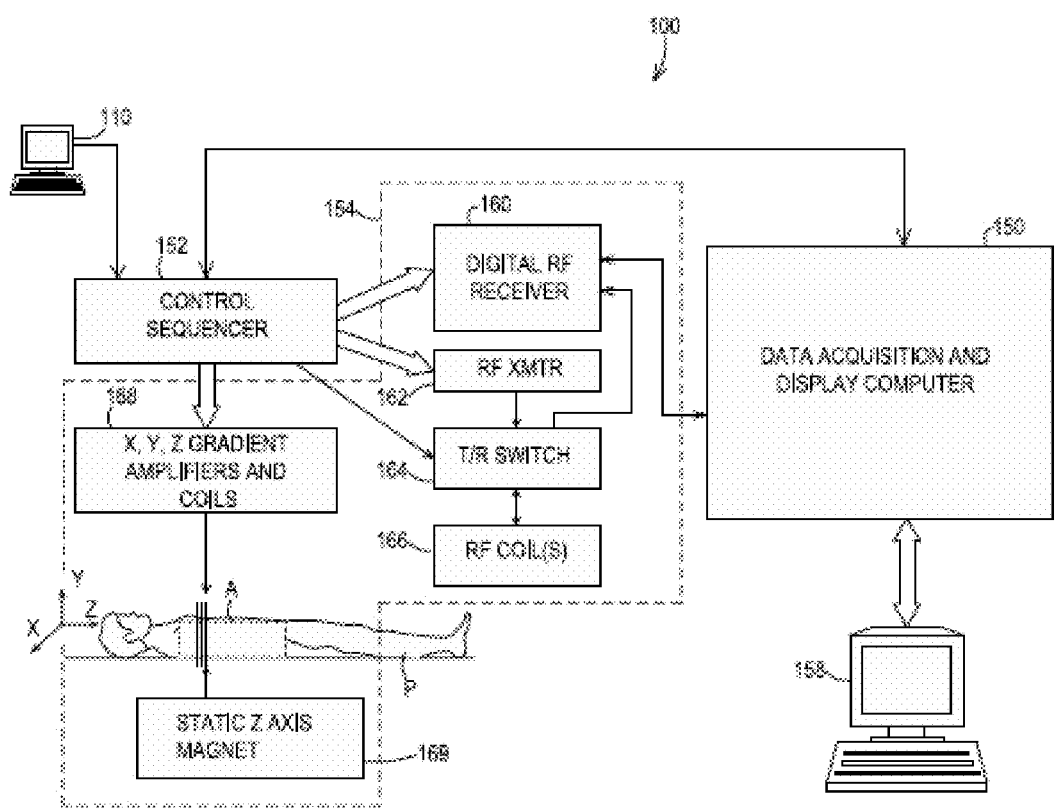
FIGS. 1A-B are block diagrams of exemplary magnetic resonance imaging (MRI) systems.

Referring to FIG. 1A, a block diagram of an exemplary magnetic resonance imaging (MRI) system 100 is illustrated. The MRI system 100 illustrates an exemplary operating environment capable of implementing aspects of the disclosed technology in accordance with one or more examples described and illustrated herein. The MRI system 100 in this example includes a data acquisition and display computer (DADC) 150 coupled to an operator console 110, an MRI real-time control sequencer 152, and an MRI subsystem 154. The MRI subsystem 154 may include a gradient subsystem 168 that includes X,Y, and Z magnetic gradient coils and associated amplifiers, a static Z-axis magnet 169, a digital radio frequency (RF) transmitter 162, a digital RF receiver 160, a transmit/receive switch 164, and RF coil(s) 166 (e.g., a whole-body RF coil).

The static Z-axis magnet 169 can provide a biasing magnetic field and the RF coil(s) 166 and subject P are positioned within the field of the Z-axis magnet 169. The RF coil(s) 166 can include a transmit coil, a receive coil, and/or a transceiver coil, for example. The RF coil(s) 166 are in communication with a processor (e.g., the control sequencer 152 and/or the processing unit 202 of the DADC 150). In various examples, the RF coil(s) 166 both transmit and receives RF signals relative to subject P. The MRI subsystem 154 can also include an analog-to-digital converter (ADC), a digital-to-analog converter (DAC), an amplifier, a filter, and/or other modules configured to excite the RF coil(s) 166 and/or receive a signal from the RF coil(s) 166.

The MRI subsystem 154 may be controlled in real-time by the control sequencer 152 to generate magnetic and/or RF fields that stimulate magnetic resonance phenomena in a subject P to be imaged, for example to implement MRI sequences in accordance with various examples of the present disclosure. A contrast-enhanced image of an area of interest A of the subject P may be shown on display 158 coupled to or integral with the DADC 150. The display 158 may be implemented through a variety of output interfaces, including a monitor, printer, and/or data storage device, for example.

The area of interest A corresponds to a region associated with one or more physiological activities in subject P in some examples. The area of interest shown in the example of FIG. 1A corresponds to a chest region of subject P, but it should be appreciated that the area of interest for purposes of implementing various aspects of this technology is not limited to the chest area. It also should be appreciated that the area of interest may encompass various areas of subject P associated with various physiological characteristics, such as, but not limited to the heart region, brain region, upper or lower extremities, or other organs or tissues. Physiological activities that may be evaluated by methods and systems in accordance with various example of the present disclosure may include, but are not limited to, various cardiac activities including myocardial strain, and also may relate to aspects of fluid flow and/or muscular or other organ movement or other conditions.

Figure 1B:
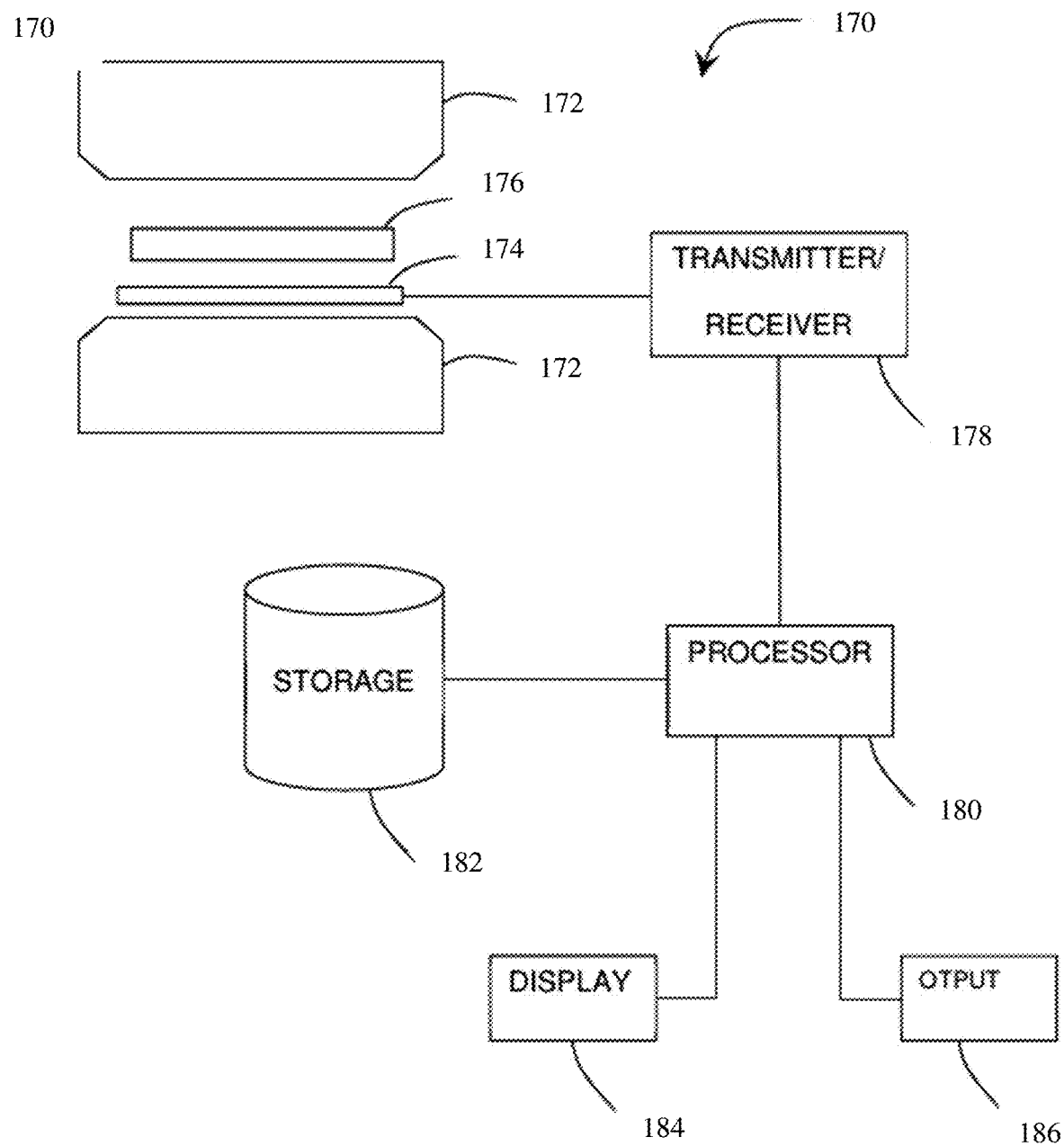

Referring to FIG. 1B, another MRI system 170 is illustrated. The system 170, or selected parts thereof, can be referred to as an MR scanner. Various embodiments as disclosed herein, or any other applicable embodiments as desired or required, can be implemented within the MRI system 170. The MRI system 170, in one example, has a magnet 172. The magnet 172 can provide a biasing magnetic field. A coil 174 and subject 176 are positioned within the field of magnet 172. The subject 176 can include a human body, an animal, a phantom, or other specimen.

The coil 174 can include a transmit coil, a receive coil, a separate transmit coil and receive coil, or a transceiver coil. The coil 174 is in communication with a transmitter/receiver unit 178 and with a processor 180. In various examples, the coil 174 both transmits and receives RF signals relative to subject 176. The transmitter/receiver unit 178 can include a transmit/receive switch, an analog-to-digital converter (ADC), a digital-to-analog converter (DAC), an amplifier, a filter, or other modules configured to excite coil 174 and to receive a signal from the coil 174.

The processor 180 can include a digital signal processor, a microprocessor, a controller, or other module. The processor 180, in one example, is configured to generate an excitation signal (for example, a pulse sequence) for the coil 174. The processor 180, in one example, is configured to perform a post-processing operation on the signal received from the coil 174. The processor 180 is also coupled to storage 182, display 184 and output unit 186.

The storage 182 can include a memory for storing data. The data can include image data as well as results of processing performed by the processor 180. In one example, the storage 182 provides storage for executable instructions for use by the processor 180. The instructions can be configured to generate and deliver a particular pulse sequence or to implement a particular algorithm, as described and illustrated in more detail below.

The display 184 can include a screen, a monitor, or other device to render a visible image corresponding to the subject 176. For example, the display 184 can be configured to display a radial projection, photographic or video depictions, two-dimensional images, or other view corresponding to subject 176. The output unit 186 can include a printer, a storage device, a network interface or other device configured to receive processed data.

The system 170 may include the MRI coil 174 for taking raw image data from the subject 176, the processor 180 may be capable for performing any of the operations described herein, the output 186 may be capable for outputting the image, and the display 184 may be capable for displaying the image. The output 186 can include one or more of a printer, storage device and a transmission line for transmitting the image to a remote location. Code for performing the above operations can be supplied to the processor 180 on a non-transitory machine-readable medium or any suitable computer-readable storage medium. The machine-readable medium includes executable instructions stored thereon for performing any of the methods disclosed herein or as desired or required for aspects of the technology described and illustrated herein.

Figure 2:
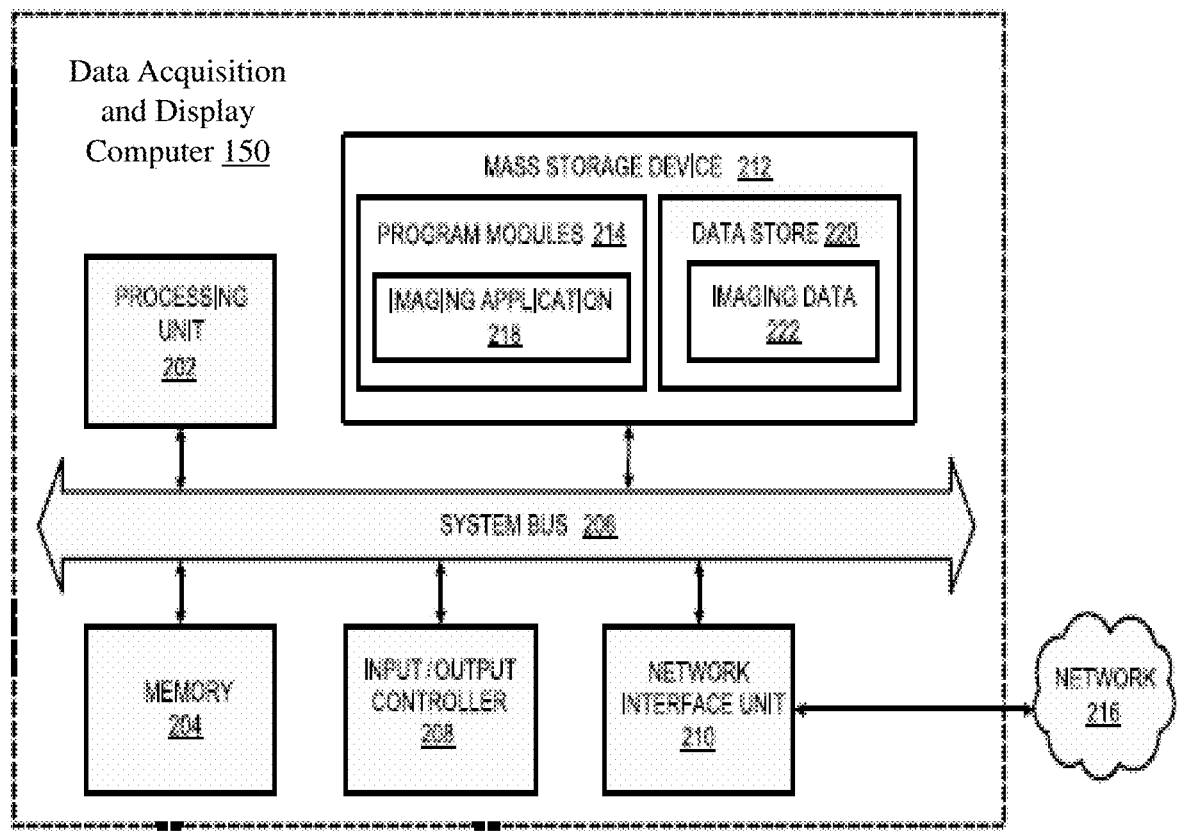
FIG. 2 is a block diagram of an exemplary data acquisition and display computer of the exemplary MRI system of FIG. 1A that in some examples includes the processor of FIG. 1B.

Referring to FIG. 2, a block diagram of the exemplary DADC 150 is disclosed. The DADC 150 is capable of implementing aspects of the disclosed technology in accordance with one or more examples described herein. The DADC 150 may be configured to perform one or more functions associated with examples described and illustrated herein with reference to FIGS. 3-7. It should be appreciated that the DADC 150 may be implemented within a single computing device or a computing system formed with multiple connected computing devices. The DADC 150 may be configured to perform various distributed computing tasks, in which processing and/or storage resources may be distributed among the multiple devices.

The DADC 150 in this particular example includes a processing unit 202, a system memory 204, and a system bus 206 that couples the system memory 204 to the processing unit 202. The processing unit 202 can include a central processing unit (CPU), processor(s), and/or special purpose logic circuitry (e.g., a field programmable gate array (FPGA) and/or an application-specific integrated circuit (ASIC))). The system bus 206 may enable the processing unit 202 to read code and/or data to/from a mass storage device 212 or other computer-storage media212 storing program modules 214.

The mass storage device 212 is connected to the processing unit 202 through a mass storage controller (not shown) connected to the system bus 206. The mass storage device 212 and its associated computer-storage media provide non-volatile storage for the DADC 150. Although the description of computer-storage media contained herein refers to a mass storage device, such as a hard disk or solid state drive, it should be appreciated by those skilled in the art that computer-storage media can be any available computer storage media that can be accessed by the DADC 150.

By way of example only, the mass storage device 212 may include volatile and/or non-volatile, removable and/or non-removable media implemented in any method or technology for storage of information such as computer-storage instructions, data structures, program modules, or other data. For example, computer storage media can include RAM, ROM, EPROM, EEPROM, flash memory or other solid state memory technology, or other optical storage, magnetic cassettes, magnetic tape, magnetic disk storage or other magnetic storage devices, or any other medium which can be used to store the desired information and which can be accessed by the DADC 150.

Accordingly, examples of this technology can be implemented in digital electronic circuitry, in computer hardware, in firmware, in software, or in any combination thereof. Examples can be implemented using a computer program product (e.g., a computer program, tangibly embodied in an information carrier or in a machine readable medium, for execution by, or to control the operation of, the processing unit 202 and/or the processor 180). The computer program can be written in any programming language, including compiled or interpreted languages, and it can be deployed in any form, including as a stand-alone program or as a software module, subroutine, or other unit suitable for use in a computing environment.

Thus, the examples of the technology described and illustrated herein may be embodied as one or more non-transitory computer or machine readable media, such as the mass storage device 212, having machine or processor-executable instructions stored thereon for one or more aspects of the present technology, which when executed by processor(s), such as processing unit 202 and/or processor 180, cause the processor(s) to carry out the steps necessary to implement the methods of this technology, as described and illustrated with the examples herein. In some examples, the executable instructions are configured to perform one or more steps of a method, such as one or more of the exemplary methods described and illustrated below with reference to FIGS. 3-7, for example.

According to various examples of this technology, the DADC 150 may operate in a networked environment using connections to other local or remote computers through a network 216 via a network interface unit 210 connected to the system bus 206. The network interface unit 210 may facilitate connection of the computing device inputs and outputs to one or more suitable networks and/or connections such as a local area network (LAN), a wide area network (WAN), the Internet, a cellular network, a radio frequency (RF) network, a Bluetooth-enabled network, a Wi-Fi enabled network, a satellite-based network, or other wired and/or wireless networks for communication with external devices and/or systems.

The DADC 150 may also include an input/output controller 208 for receiving and processing input from any of a number of input devices. Input devices may include one or more of keyboards, mice, stylus, touchscreens, microphones, audio capturing devices, and image/video capturing devices. An end user may utilize the input devices to interact with a user interface, for example a graphical user interface, for managing various functions performed by the DADC 150.

The program modules 214 may include instructions operable to perform tasks associated with examples illustrated in one or more of FIGS. 3-7. The program modules 214 may include an imaging application 218 for performing data acquisition and/or processing functions as described herein, for example to instruct the control sequencer 152 and/or acquire and/or process image data corresponding to magnetic resonance imaging the an area of interest A. The DADC 150 can include a data store 220 for storing data that may include imaging-related data 222 such as acquired data from the implementation of MRI pulse sequences in accordance with various examples of the present disclosure.

Referring back to FIG. 1A, the operation of the MRI system 100 in some examples is controlled from the operator console 110, which includes one or more processors coupled to memory (e.g., a non-transitory computer readable medium) via a system bus and configured to execute programmed instructions stored in the memory to carry out one or more steps of the technology disclosed herein. The operator console 110 can also include keyboard, a control panel, and/or a display. The operator console 110 communicates through a link with the DADC 150 to enable an operator to control the operation of the control sequencer 152 and production and display of images on the screen 158. In other examples, the operator console 110 can communicate directly with the control sequencer 152 to control one or more aspects of the MRI subsystem 154.

Thus, in some examples, the DADC 150 receives commands from the operator console 110 that indicate the scan sequence and/or other parameters of the scan that is to be performed. The control sequencer 152, which is also referred to as a pulse generator, then operates the MRI system 100 components to carry out the desired scan sequence. In some examples, the DADC 150 produces data that indicates the timing, amplitude, and shape of the RF pulses which are to be produced, and the timing and length of the data acquisition window, which is used to instruct the control sequencer 152. The control sequencer 152 connects to the gradient amplifiers of the gradient subsystem 168, to indicate the timing and shape of the gradient pulses to be produced during the MRI scan.

The gradient waveforms produced by the control sequencer 152 are applied to the gradient amplifiers of the gradient subsystem 168 each of which excites a corresponding gradient coil in the gradient subsystem 168 to produce the magnetic field gradients used for spatially encoding acquired signals. The gradient subsystem 168 forms part of the MRI subsystem 154, which includes a polarizing magnet (e.g., static Z axis magnet 169) and a whole-body RF coil (e.g., RF coil(s) 166) in some examples.

A transceiver (e.g., RF transmitter 162) produces pulses that are amplified by an RF amplifier and coupled to the RF coil(s) 166 by the transmit/receive switch 164. The resulting signals radiated by the excited nuclei in the subject may be sensed by the same RF coil(s) 166 and coupled through the transmit/receive switch 164 to a preamplifier. The amplified signals are demodulated, filtered, and digitized in a receiver (e.g., RF receiver 160). The transmit/receive switch 164 is controlled by a signal from the control sequencer 152 to electrically connect the RF amplifier to the RF coil(s) 166 during the transmit mode and to connect the preamplifier during the receive mode. In some examples, the transmit/receive switch 164 also enables a separate RF coil (e.g., a head coil or surface coil of the RF coil(s) 166) to be used in either the transmit or receive mode.

The signals observed up by the RF coil(s) 166 are digitized by the RF receiver 160 and transferred to the DADC 150. When the scan is completed and an array of data has been acquired by the DADC 150, the processing unit 202 of the DADC 150 operates to Fourier transform the data into the imaging data 222 via a reconstruction technique, as described and illustrated in more detail below. In response to commands received from the operator console 110, this imaging data 122 may be archived on the mass storage device 212 or elsewhere, further processed by the processing unit 202, conveyed to the operator console 110 for display, and/or presented on the display 158.

Figure 3:
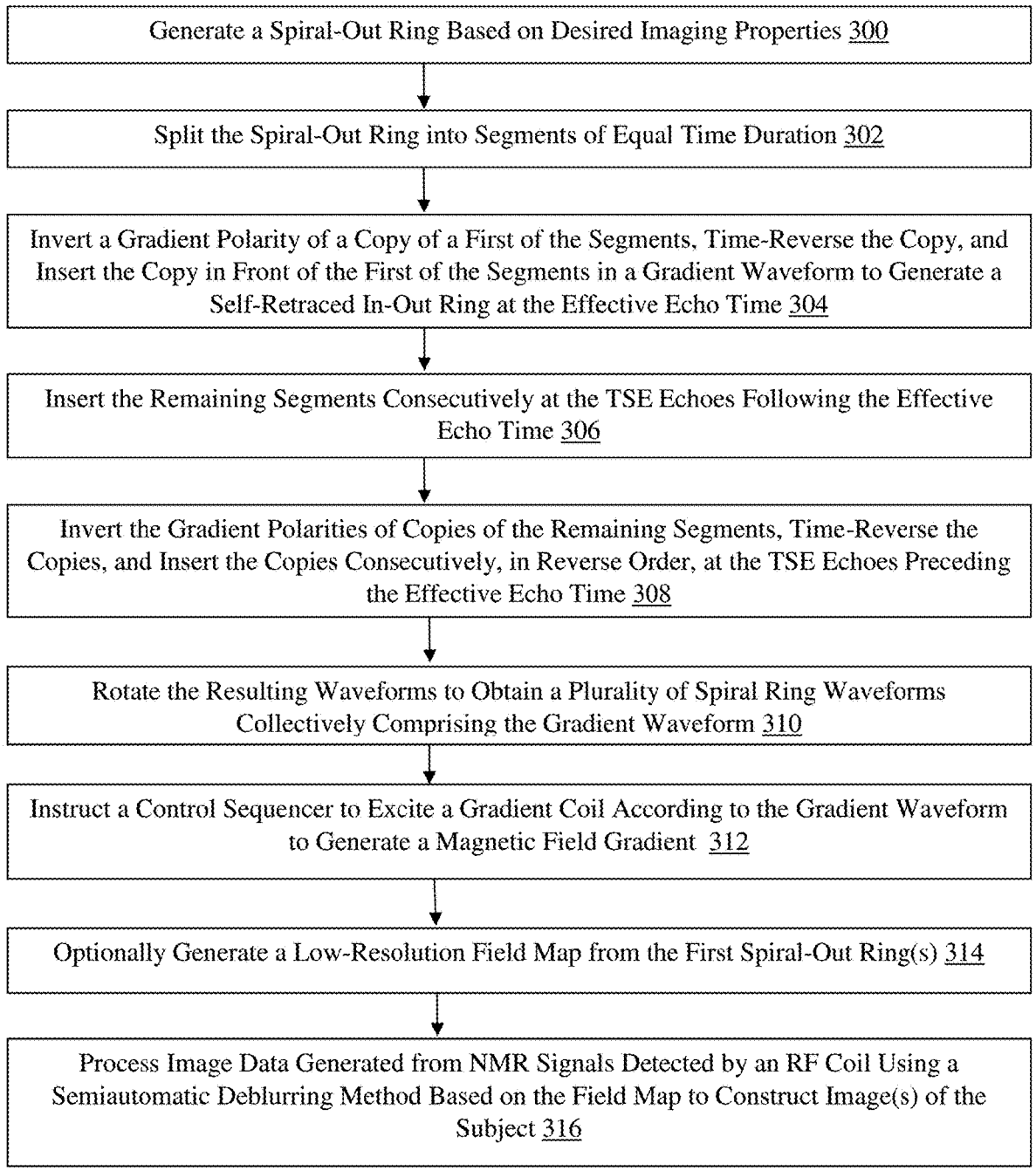
FIG. 3 is a flowchart of an exemplary method for spin-echo train imaging using spiral rings with retraced trajectories to improve MRI image quality.

Referring to FIG. 3, a flowchart illustrating an exemplary method for spin-echo train imaging using spiral rings with retraced trajectories to improve MRI image quality is illustrated. In step 300 in this example, the DADC 150 generates a relatively long spiral-out ring based on desired imaging properties, such as field-of-view (FOV), spatial resolution, and number of shots, for example.

In step 302, the DADC 150 splits the spiral-out ring generated in step 300 into segments of equal time duration. The number of segments can depend on the in-plane spatial resolution, FOV, readout acquisition time, and/or total scan time, for example, although other parameters can also be used. For example, for a given FOV, spatial resolution, and the total scan time, the spiral ring (SPRING) retraced in-out (RIO) TSE imaging described and illustrated herein (also referred to as SPRING-RIO) with a longer readout window per spiral ring requires a smaller number of segments and vice versa. Sequences with a larger number of segments will reduce the sensitivity to $B_0$ inhomogeneities but increase the RF specific absorption rate (SAR).

The effective echo time ($TE_{\mathit{eff}}$) may also affect the number of segments used for the spiral ring retraced in-out TSE imaging disclosed herein because $L \times ESP \approx TE_{\mathit{eff}}$, if L (i.e., the number of segments) fully retraced spiral-in rings are placed in the early echoes of the echo train. Empirically, sequences with a longer echo spacing (ESP) and a smaller number of segments will produce a shorter effective echo time compared to that with a shorter ESP and a larger number of segments, since the former saves a certain amount of time, such as the time used for the refocusing RF for example.

In step 304, the DADC 150 inverts a gradient polarity of a copy of a first of the number of segments generated in step 302. Then, the DADC 150 time-reverses the segment copy and inserts into a gradient waveform at the effective echo time the segment copy in front of the first segment to thereby form self-retraced in-out rings, as described and illustrated in more detail below with reference to FIG. 4.

In step 306, the DADC 150 inserts into the gradient waveform the remaining segments consecutively at the TSE echoes following the effective echo time. Thus, the gradient waveform will include spiral-out rings at each echo time after the self-retraced in-out rings, which were previously inserted at the effective echo time, through the end of the echo train.

In step 308, the DADC 150 copies the remaining segments inserted in step 306 and inverts the gradient polarities of the segment copies. The DADC 150 then time-reverses the segment copies and inserts the resulting segment copies consecutively, in reverse order, at the TSE echoes preceding the effective echo time, and the previously inserted self-retraced in-out rings, in the echo train.

In step 310, the DADC rotates the resulting waveforms associated with each ring to obtain a plurality of waveforms that collectively comprise the gradient waveform. For example, the resulting waveforms can be rotated N times to obtain $N*(2*L-1)$ ring segments in the gradient waveform.

Figure 4:
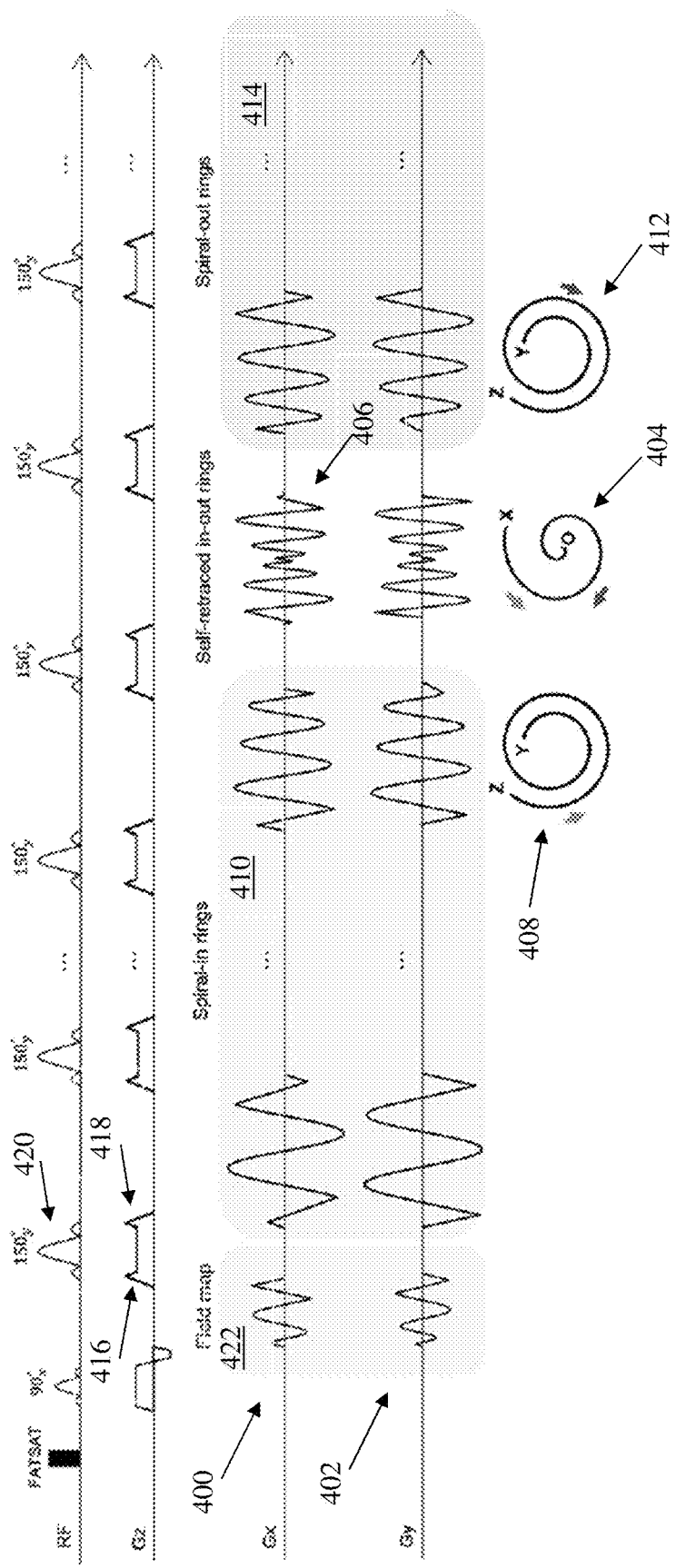
FIG. 4 is an exemplary pulse sequence timing diagram of a retraced spiral in-out gradient waveform that mitigates artifacts in TSE imaging.

Referring to FIG. 4, an exemplary pulse sequence timing diagram of a spiral ring retraced in-out gradient waveform that mitigates artifacts in TSE imaging is illustrated. In this example, the spiral ring retraced in-out gradient waveform 400 is associated with the Gx gradient axis and the retraced spiral in-out gradient waveform 402 is associated with the Gy gradient axis. The inner portion or center of k-space was sampled along the X-O-X trajectory 404 by the self-retraced in-out rings 406 associated with the first train in a single ESP. Additionally, the outer k-space was sampled twice via the Z-Y trajectory 408 by the earlier spiral-in rings 410 and the retracing of the Y-Z trajectory 410 by the later spiral-out rings 414.

For each shot, the number of spiral-in rings 410 (including the first half of the self-retraced in-out rings 406) is equal to that of the spiral-out rings 414 (including the latter half of the self-retraced in-out rings 406) in this example. In one particular example, the number of spiral-in rings 410 and spiral-out rings can be 7, with a total of 15 shots per measurement and the refocusing RF pulse angles can be set to 150° for reduced SAR.

Accordingly, in this example, a particular ring of k-space values can be sampled by two trajectories, $k_{j,p}(t)$ and $k_{j,q}(t)$, for which the subscripts j, p and j, q stand for the same $j^{th}$ k-space ring coverage but acquired at two different echoes p and q, by the respective spiral-out rings and the spiral-in rings. $T_p$ and $T_q$ refer to the time interval between the excitation RF pulse and the center of the readout window at $p^{th}$ and $q^{th}$ echoes, respectively. Because of symmetry of the retracing about TE, $T_p+T_q=2TE$, where $0 \leq p \leq L-1$, $-L+1 \leq q \leq O$, and L is the total number of spiral-out rings. Thus, for $$t \in \left[ -\frac{T}{2}, \frac{T}{2} \right],$$

$k_{j,p}(t)$ and $k_{j,q}(t)$ can be written as $k_{j,p}(t)=k_{j,q}(-t)=-k_{j,q}(t)$, where T is the readout time, and $k_{j,p}(t)$ and $k_{j,q}(t)$ are constrained to be antisymmetric and mirrored at time points symmetric about the spin echo. The central self-retraced in-out rings 406 can be considered as the special case when p=q=0.

The gradient waveform in this example therefore includes a series of annular spiral ring segments, including a self-retraced in-out ring 406 for the center of k-space, and spiral-out rings 414 at the end of the echo train paired with time-reversed spiral-in rings 410 with opposite gradient polarity at the beginning of the echo train, to acquire the outer portion of k-space. Other trajectories can also be used in other examples, and any number of spiral-in rings and spiral-out rings can also be used.

Referring back to FIG. 3, in step 312, the DADC 150 instructs the control sequencer 152 to excite the coil(s) of the gradient subsystem 168 according to the gradient waveform (e.g., gradient waveform 400 and/or 402) to generate a magnetic field gradient, optionally in two gradient axes (i.e., Gx and Gy). In some examples, a constant non-zero zeroth order gradient moment is provided by crusher gradients surrounding refocusing RF pulses.

The zeroth order gradient moments of the spiral readout gradients can be nulled in each ESP by surrounding them with prephaser gradients that move out from the origin of k-space to the beginning of the segment, and rephaser gradients that move back to the origin from the end of the segment. The prephaser and rephaser lobes can be played simultaneously with the crusher gradients. Referring back to FIG. 4, exemplary crusher gradients 416 and 418 are illustrated surrounding the exemplary refocusing RF pulse 420.

In some examples, the gradient waveform used in step 312 (e.g., gradient waveform 400 and/or 402) includes relatively short spiral-out rings placed in the interval between the excitation and the first refocusing RF pulse for field map acquisition, optionally with a 1 ms interval between the odd and even shots, to allow for a range of ±500 Hz off-resonance. In these examples, in step 314, the DADC 150 optionally generates a relatively low resolution field map from the first annular spiral segment, which can be used in image reconstruction. The field map is advantageously generated from the first short spiral-out ring(s) by extracting the phase difference between the odd shots and even shots. In FIG. 4, an exemplary field map segment 422 is illustrated preceding the spiral-in rings 410 and proximate the first echo in the echo train.

In step 316, the DADC 150 obtains and digitizes image data following detection of NMR signals by RF coil (e.g., RF coil(s) 166). The DADC 150 then processes the image data according to reconstruction-based correction technique(s) to generate image(s) of the subject. In some examples, model-based k-space estimation and semiautomatic off-resonance correction techniques can be implemented to minimize effects of k-space trajectory infidelity and $B_0$ inhomogeneity, respectively.

Gradient infidelity is one of the concerns for reliable spiral readout imaging. The k-space trajectories can be measured and incorporated into reconstruction to improve image quality, yet it is impractical to do that for every imaging slice and each sequence parameter set. Accordingly, a model-based method is used in some examples that combines tuning the anisotropic delays on different gradient axes and eddy current compensation can be used to estimate the actual k-space trajectories. The calculated system parameters can be used for later scans after a one-time gradient waveform calibration with no time penalty.

While moderate off-resonance effects can be automatically corrected by the spiral retraced in-out design; at large off-resonance values, this effect may degrade, and blurring may remain. In some examples of this technology, a semiautomatic deblurring method was used with a relatively low-resolution field map (e.g., field map 422) and the following maximized energy objective function $$\max_{\omega_i} \int h(r-r')\tilde{m}(r';\omega_i(r'))\tilde{m}(r';\omega_i(r'))^* dr',$$

where $\tilde{m}(r;\omega_i(r))^*$ is the complex conjugate of $\tilde{m}(r;\omega_i(r))$. The global maximum of this objective function is invariant with T2 decay and invariant with image phase, which eliminates the need to accurately remove the incidental phase before applying this criterion.

Figure 5:
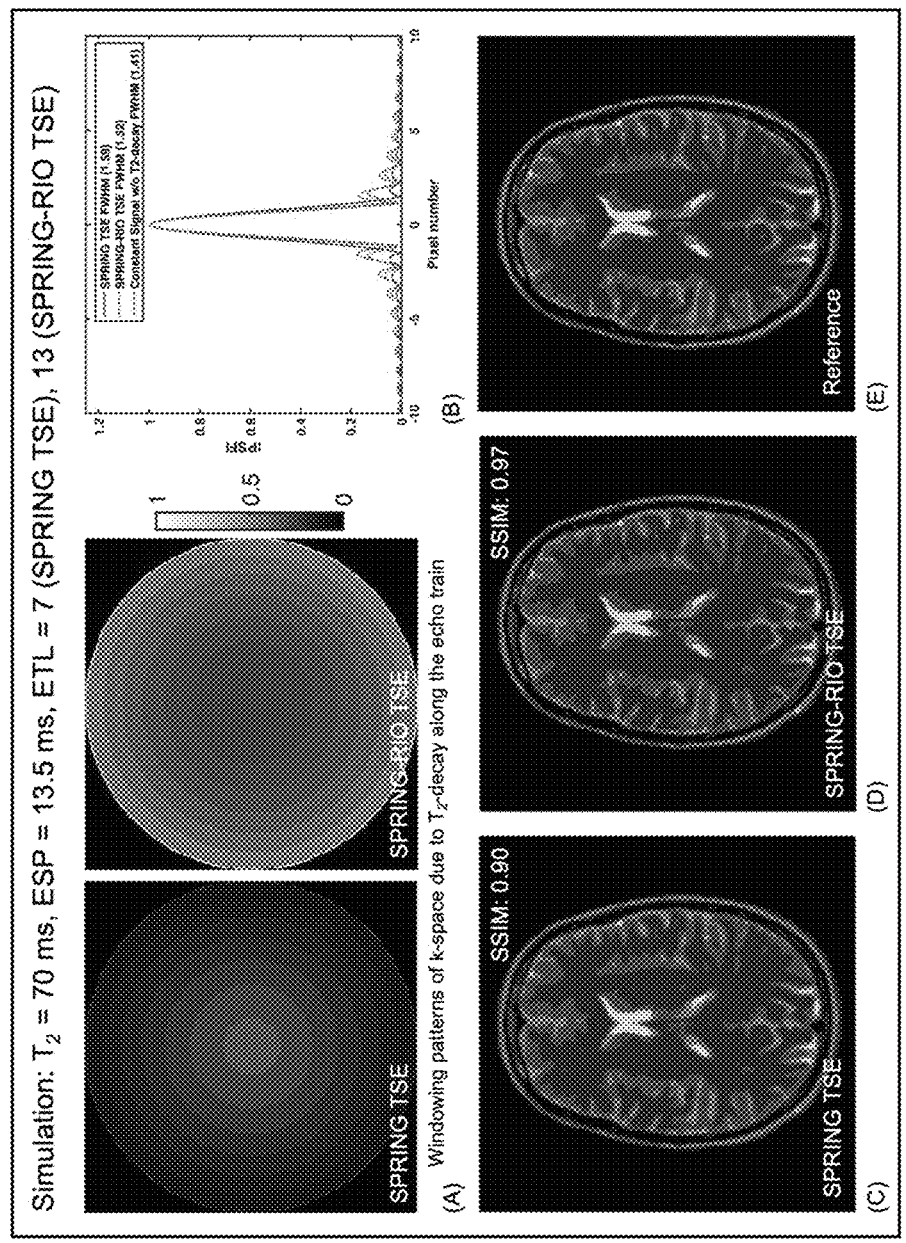
FIG. 5 illustrates simulation results of T2-decay effect for spiral ring TSE imaging and spiral ring retraced in-out TSE imaging.

Referring to FIG. 5, simulation results of T2-decay effect for spiral ring TSE imaging and the spiral ring retraced in-out TSE imaging described herein are illustrated. The windowing patterns of k-space due to T2 relaxation during acquisition are shown in the top row of FIG. 5. For spiral ring TSE imaging, T2 relaxation results in a windowing of the data, with higher spatial frequencies losing signal, causing a broadening of the main lobe of the PSF (FWHM:1.59). The retraced in-out approach in the spiral ring retraced in-out TSE imaging described and illustrate herein produces a smoother frequency response, thus maintaining a point-spread function (PSF) main lobe (FWHM:1.32) nearly as sharp as that for the constant signal with no T2-decay effects (FWHM:1.41). The comparison among the bottom images reconstructed from spiral ring TSE imaging, spiral ring retraced in-out TSE imaging, and a reference, and the corresponding structural similarity index measure (SSIM) values, demonstrate the advantage of using retraced in-out sampling for reducing T2-decay induced blur and subsequent resolution loss.

Figure 6:
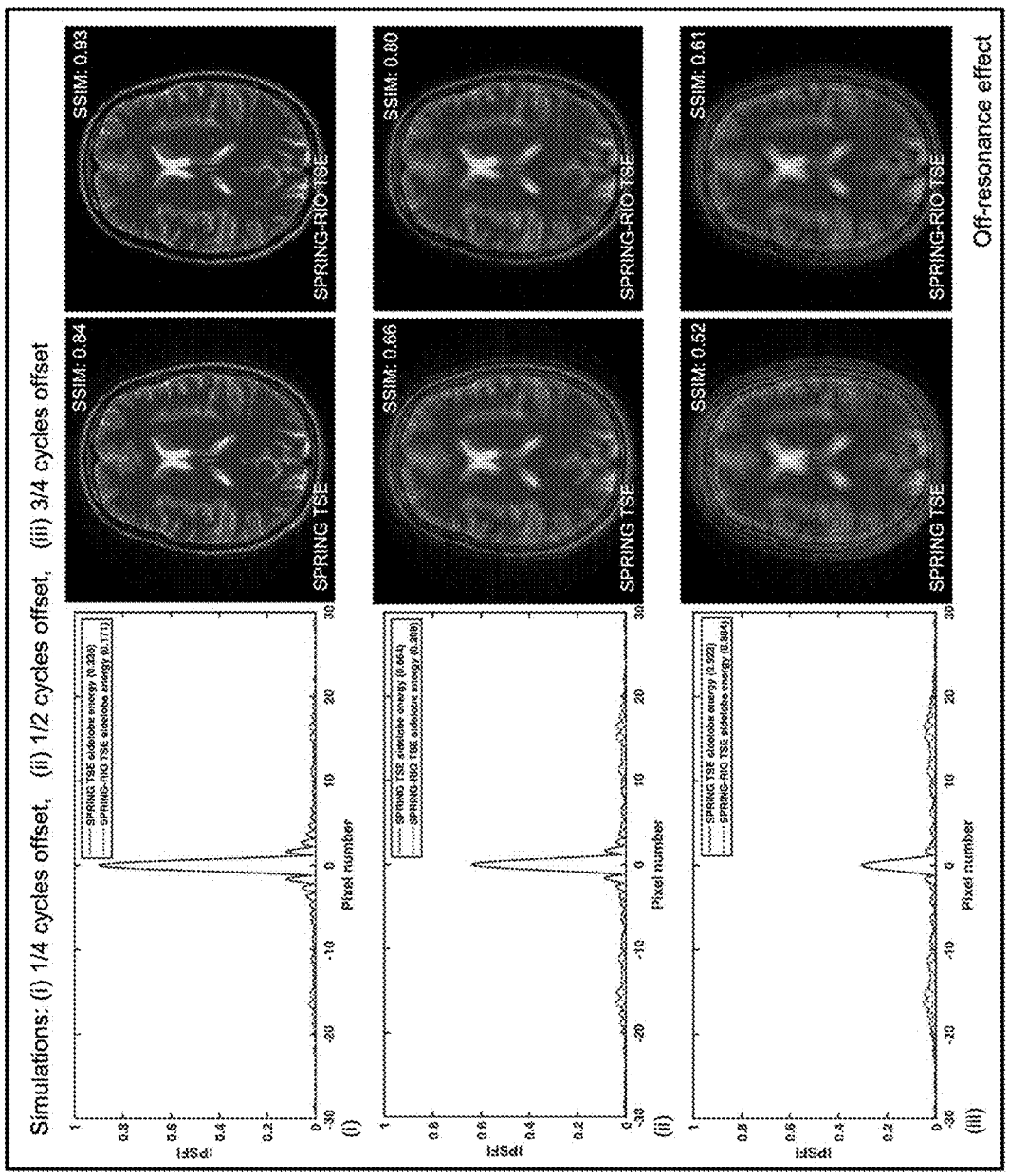
FIG. 6 illustrates simulation results of off-resonance effects for spiral ring TSE imaging and spiral ring retraced in-out TSE imaging.

Referring to FIG. 6, simulation results of off-resonance effects for spiral ring TSE imaging and spiral ring retraced in-out TSE imaging are illustrated. FIG. 6 shows the PSFs for ¼, ½, and ¾ phase cycles of phase accrual from off-resonance over each of the annular spiral ring segments. For both sequences, the effect of the refocusing RF pulses is to modulate the blurring so that there is not a substantial apparent loss of image resolution, but there is a signal loss that increases with off-resonance frequency. spiral ring retraced in-out TSE imaging performs better than spiral ring TSE imaging with less energy in the side lobes of the PSF. The reconstructed digital phantom images along with the SSIM values demonstrate this signal degradation with increasing off-resonance frequency, and the merit of retraced in-out trajectory for self-correction of moderate off-resonance effects ranging up to ½ phase cycle.

Figure 7:
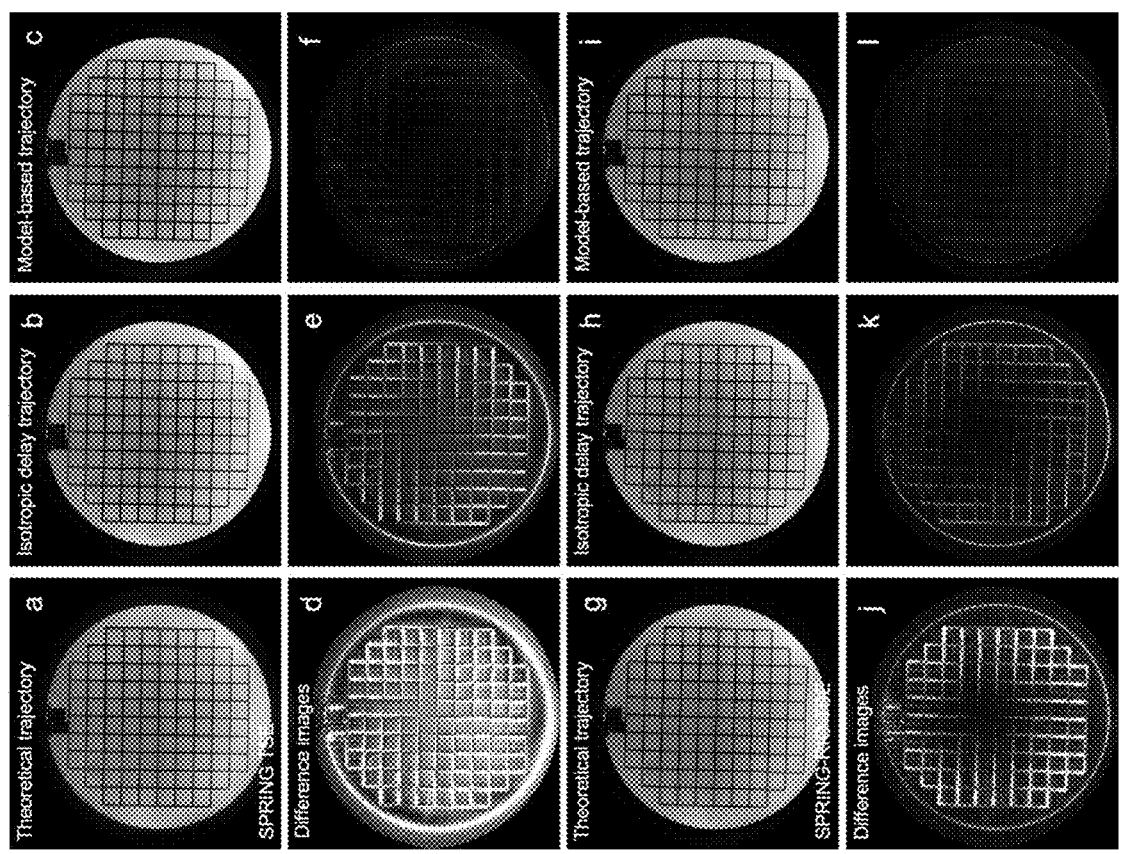
FIG. 7 illustrates reconstructed images of an axial slice in the resolution phantom from spiral ring TSE imaging and spiral ring retraced in-out TSE imaging and absolute difference images relative to the goal images based on measured k-space trajectories.

Referring to FIGS. 7, reconstructed images of an axial slice in the resolution phantom from spiral ring TSE imaging and spiral ring retraced in-out TSE imaging and absolute difference images relative to the goal images based on measured k-space trajectories are illustrated. FIG. 7 shows reconstructions of one axial slice from a resolution phantom from spiral ring TSE imaging (a-f) and spiral ring retraced in-out TSE imaging (g-i) acquisitions using a theoretical trajectory (a,g), isotropic delay corrected trajectory (b,h), and model-based trajectory (c,i), as well as their corresponding absolute difference images relative to the goal images based on measured k-space trajectories.

Images with isotropic delay corrected k-space trajectories still show noticeable artifacts, mainly around edges, and shading and shape distortions. A slight distortion remaining in k-space trajectories (e.g., anisotropic delays and different eddy current terms on different physical gradient axes) would also cause significant artifacts. Improvements can be easily seen in FIG. 7 (c,i) when using a model-based estimated trajectory, which removes most artifacts.

Comparing difference images between spiral ring TSE imaging (d,e) and spiral ring retraced in-out TSE imaging (j,k) sequences, the spiral ring retraced in-out TSE imaging technique is less sensitive to the gradient delays, possibly due to the time-reversed signal average between spiral-in and spiral-out rings, which averages some shape distortions.

Figure 8:
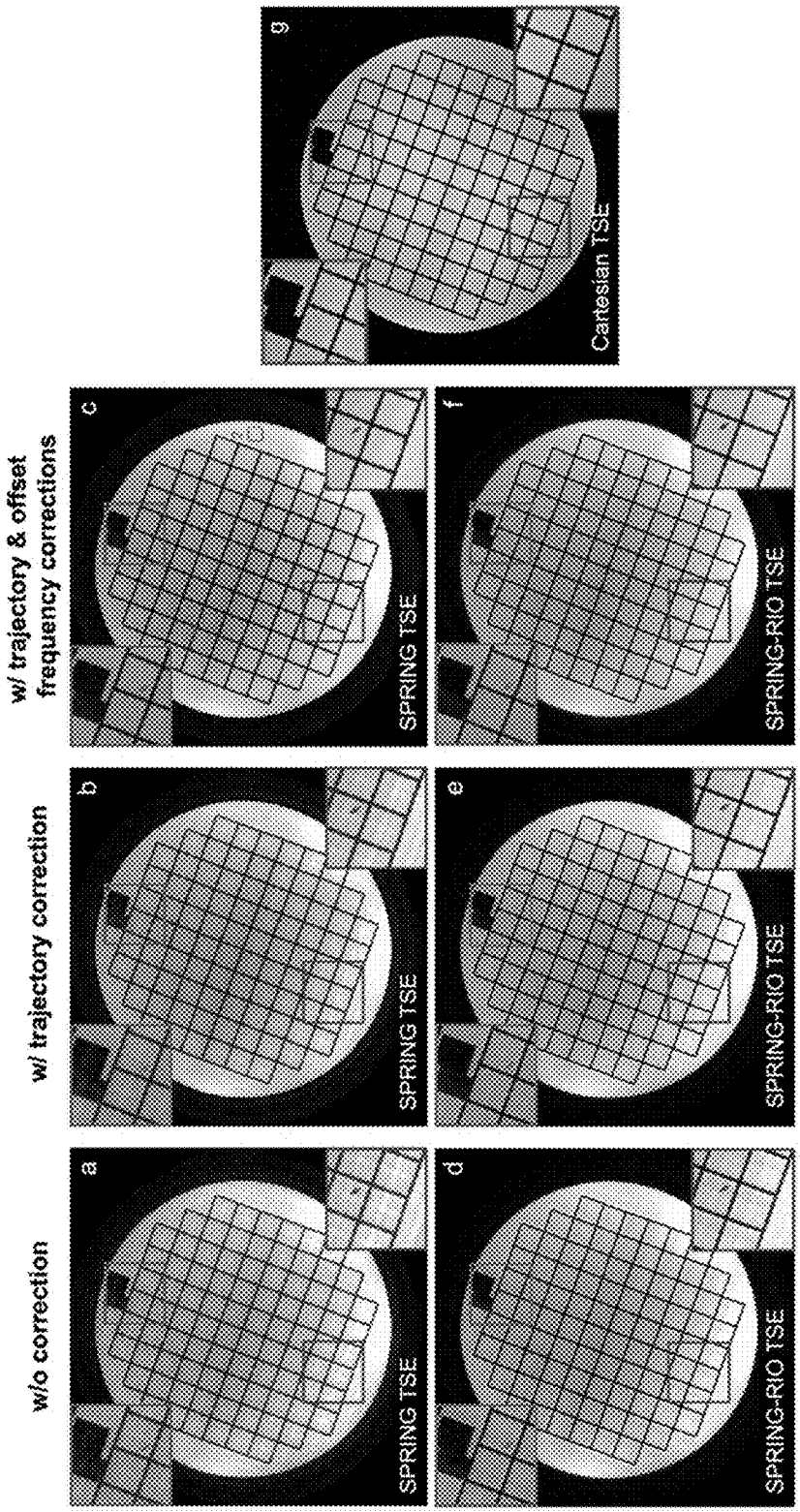
FIG. 8 illustrates performance of trajectory and off-resonance corrections for spiral ring retraced in-out TSE imaging.

Referring to FIG. 8, performance of trajectory and off-resonance corrections for spiral ring retraced in-out TSE imaging is illustrated. FIG. 8 illustrates the efficacy of trajectory and off-resonance corrections for spiral ring TSE imaging versus spiral ring retraced in-out TSE imaging. The reduction of edge artifacts by using the model-based estimated trajectories for both of the spiral ring sequences can be seen in FIG. 8 (b,e) from the zoomed portions of the images indicated by the boxes, when compared to the corresponding regions in FIG. 8 (a,d). By further performing a semiautomatic deblurring method as explained above, for example, both the artifacts and signal loss are significantly reduced in the fully corrected images shown in FIG. 8 (c,f).

Comparing images between spiral ring TSE imaging (FIG. 8 (a-c)) and spiral ring retraced in-out TSE imaging (FIG. 8 (d-f)) sequences, images with higher SNR and improved sharpness can be seen for spiral ring retraced in-out TSE imaging, primarily due to the additional spiral-in rings acquired before the effective echo time. Further, in the presence of nonlinear B0 variation, the uncorrected spiral ring retraced in-out TSE imaging sequence presents fewer image artifacts than an uncorrected spiral ring TSE imaging acquisition (FIG. 8 (b versus e)), thus demonstrating that the self-correcting retraced in-out trajectory shows certain robustness to moderate off-resonance effects.

Figure 9:
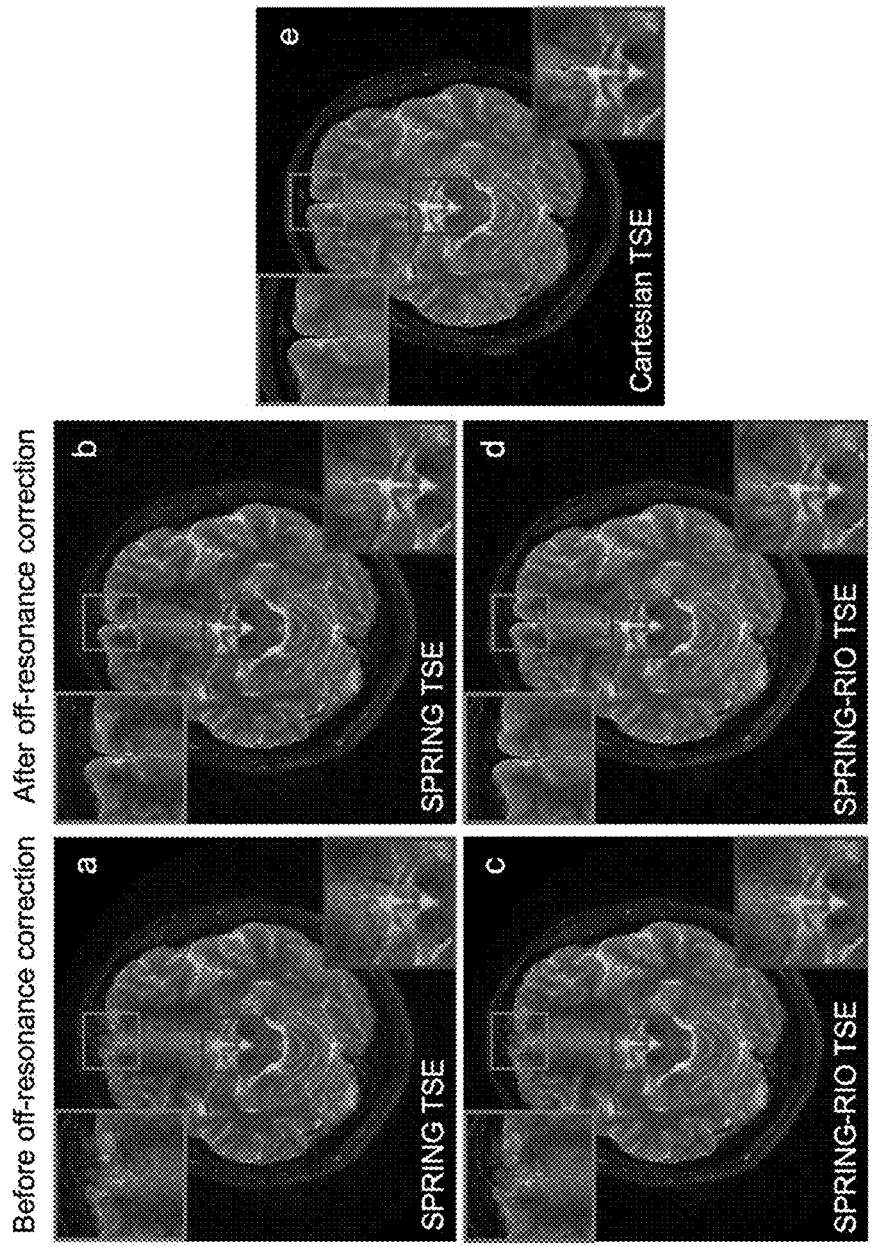
FIG. 9 illustrates a comparison of axial brain images acquired with spiral ring TSE imaging and spiral ring retraced in-out TSE imaging and reconstructed before and after off-resonance correction.

Referring to FIG. 9, a comparison of axial brain images acquired with spiral ring TSE imaging and spiral ring retraced in-out TSE imaging and reconstructed before and after off-resonance correction is illustrated. The zoomed portions of the images on the left (a, c) before off-resonance correction, are consistent with simulation results and phantom studies, showing that artifacts caused by modest $B_0$ inhomogeneities can be reduced by the retraced in-out approach described herein. The images in the right column (b, d) demonstrate the efficacy of off-resonance correction. The spiral ring retraced in-out TSE imaging acquisition with semiautomatic off-resonance correction using a maximized energy objective function achieves overall better image quality than the spiral ring TSE imaging acquisition with semiautomatic off-resonance correction using a minimum phase objective function, in terms of SNR, residual artifacts, and image blurring.

Figure 10:
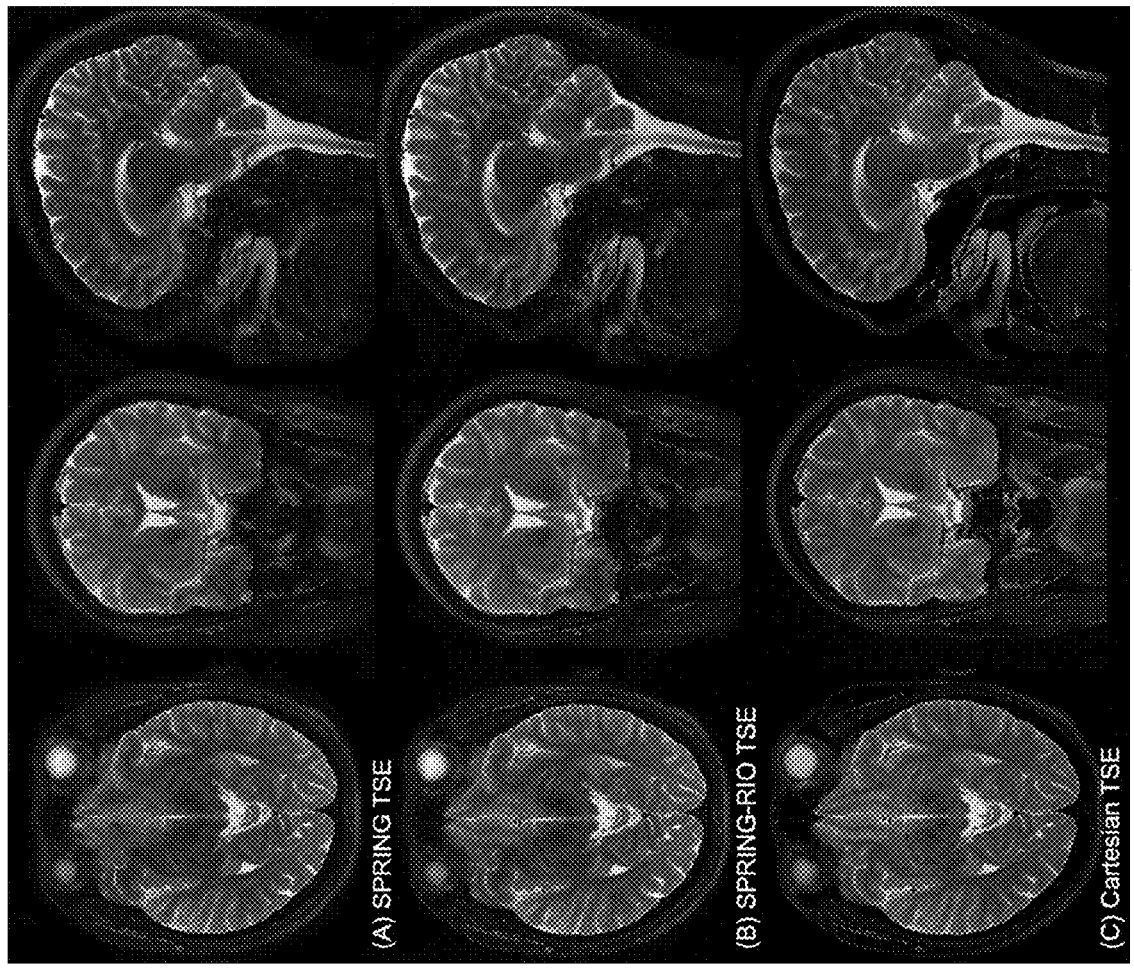
FIG. 10 illustrates a comparison of trajectory- and off-resonance-corrected axial, coronal, and sagittal brain images from spiral ring TSE imaging and spiral ring retraced in-out TSE imaging.

Referring to FIG. 10, a comparison of trajectory- and off-resonance-corrected axial, coronal, and sagittal brain images from spiral ring TSE imaging and spiral ring retraced in-out TSE imaging is illustrated. The images in FIG. 10 are reconstructed using estimated trajectories and B0 off-resonance corrections, and with two signal averages. The red arrows point to regions in the spiral ring TSE imaging brain images that show residual artifacts (presumably from off-resonance) even after correction, especially near air-tissue boundaries where the susceptibility gradients are relatively strong. Compared to spiral ring TSE imaging, spiral ring retraced in-out TSE imaging produces sharper images with less T2-decay induced blurring, as presented in some tissues with short T2 values, such as skull and bone.

Figure 11:
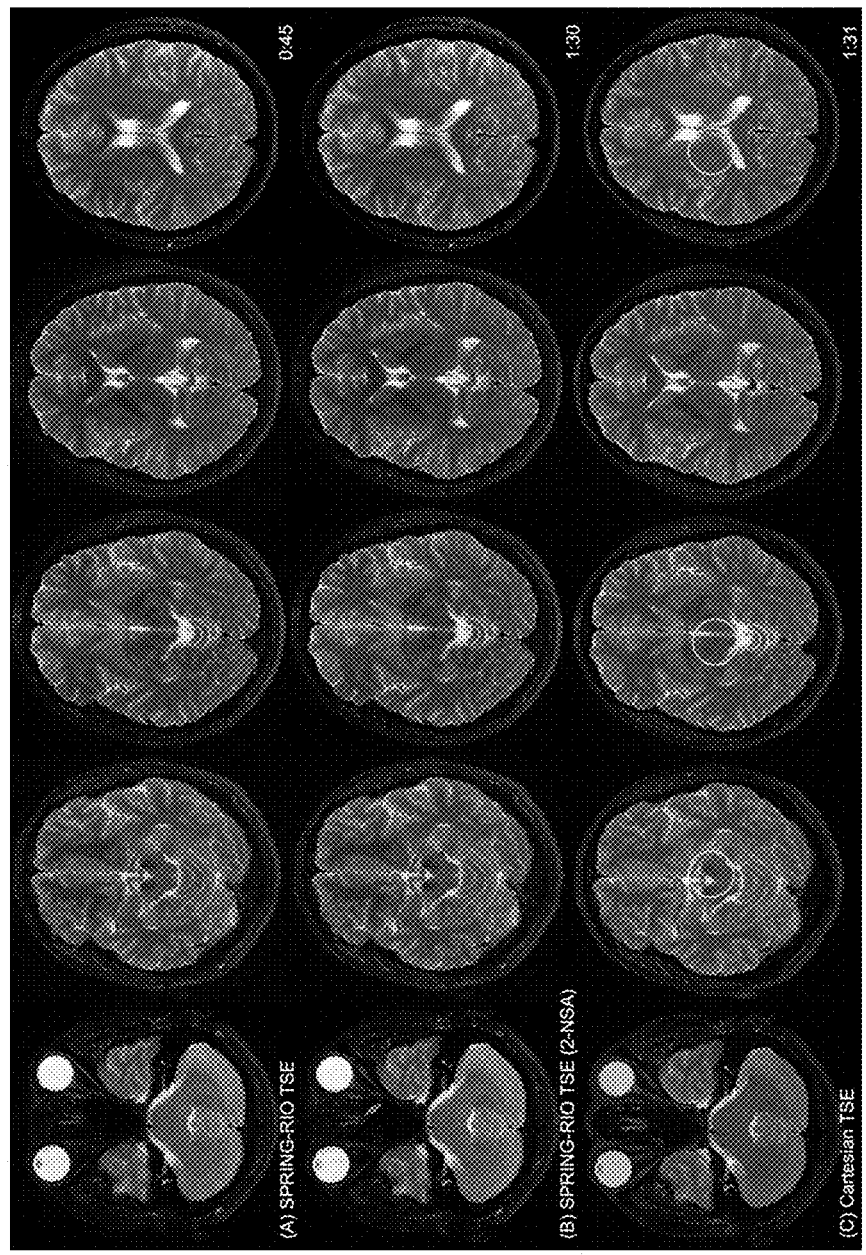
FIG. 11 illustrates a comparison of in-vivo axial images acquired using spiral ring retraced in-out TSE imaging and standard Cartesian TSE imaging.

Referring to FIG. 11, a comparison of in-vivo axial images acquired using spiral ring retraced in-out TSE imaging and standard Cartesian TSE imaging is illustrated. More specifically, FIG. 11 shows a comparison of axial images acquired using the spiral ring retraced in-out TSE imaging described herein, with one signal average (top row) and with two signal averages (middle row), and standard Cartesian TSE imaging (bottom row). No obvious artifacts are observed in the spiral ring retraced in-out TSE imaging.

The results indicate that the image quality of spiral ring retraced in-out TSE imaging with 1-NSA is, in general, comparable to that of Cartesian TSE, yet with only half of the scan time that is used for Cartesian TSE imaging. With 2-NSA, spiral ring retraced in-out TSE imaging shows a higher SNR, and that with both 1-NSA and 2-NSA show similar or slightly better contrast than the Cartesian TSE imaging counterpart in some areas indicated by the yellow circles, such as the dentate nuclei, substantial nigra, and red nuclei.

Figure 12:
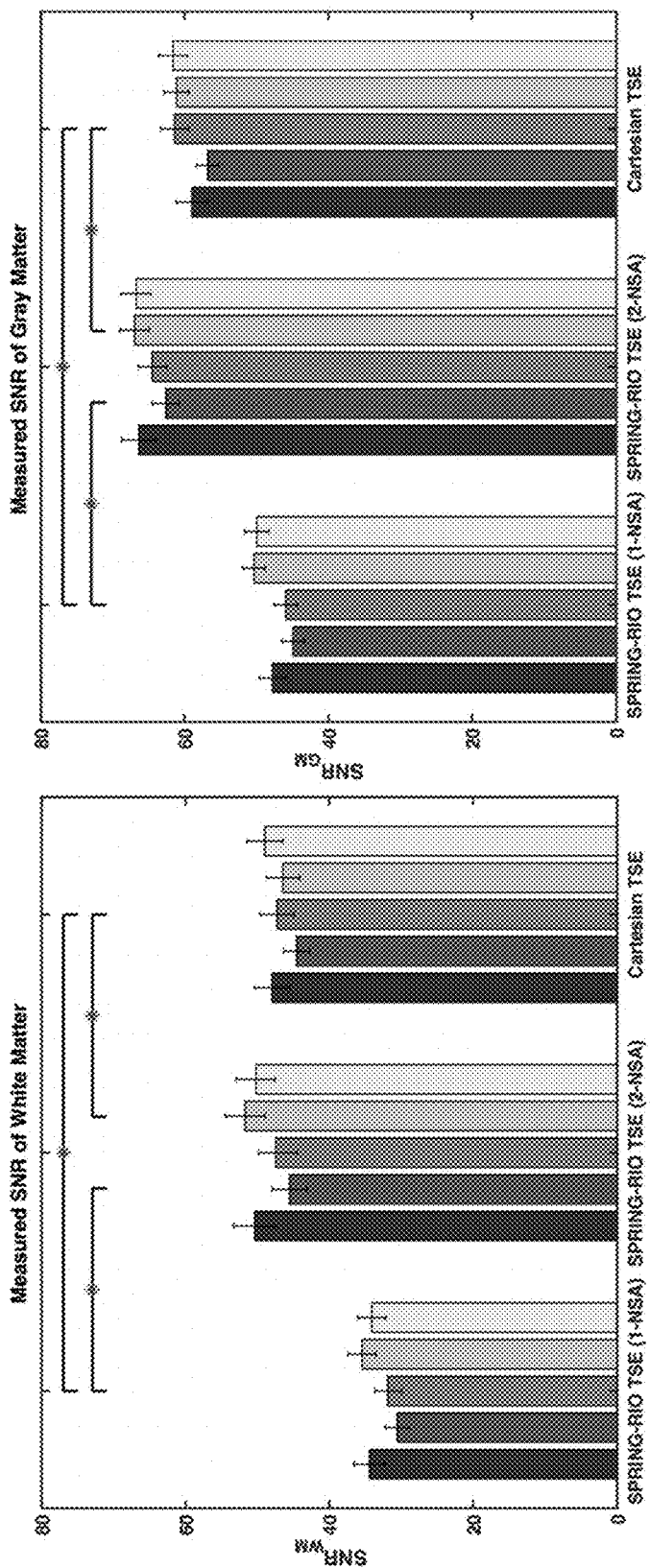
FIG. 12 illustrates measured signal to noise ratio of regions of interest in white matter and gray matter with spiral ring retraced in-out TSE imaging with one signal average, with two signal averages, and standard Cartesian TSE imaging.

Referring to FIG. 12, measured SNR of ROIs in white matter and gray matter with spiral ring retraced in-out TSE imaging with one signal average, with two signal averages, and standard Cartesian TSE imaging are illustrated. The different bars for each method represent the values computed for five different volunteers. For each volunteer, ten slices are selected for SNR calculation, and thus pairwise comparisons among sequences are performed on a total of 50 pairs of SNR measurements. The asterisks indicate statistically significant differences between the methods (P<0.05). spiral ring retraced in-out TSE imaging (2-NSA) has the highest SNR in both white matter and gray matter.

Figure 13:
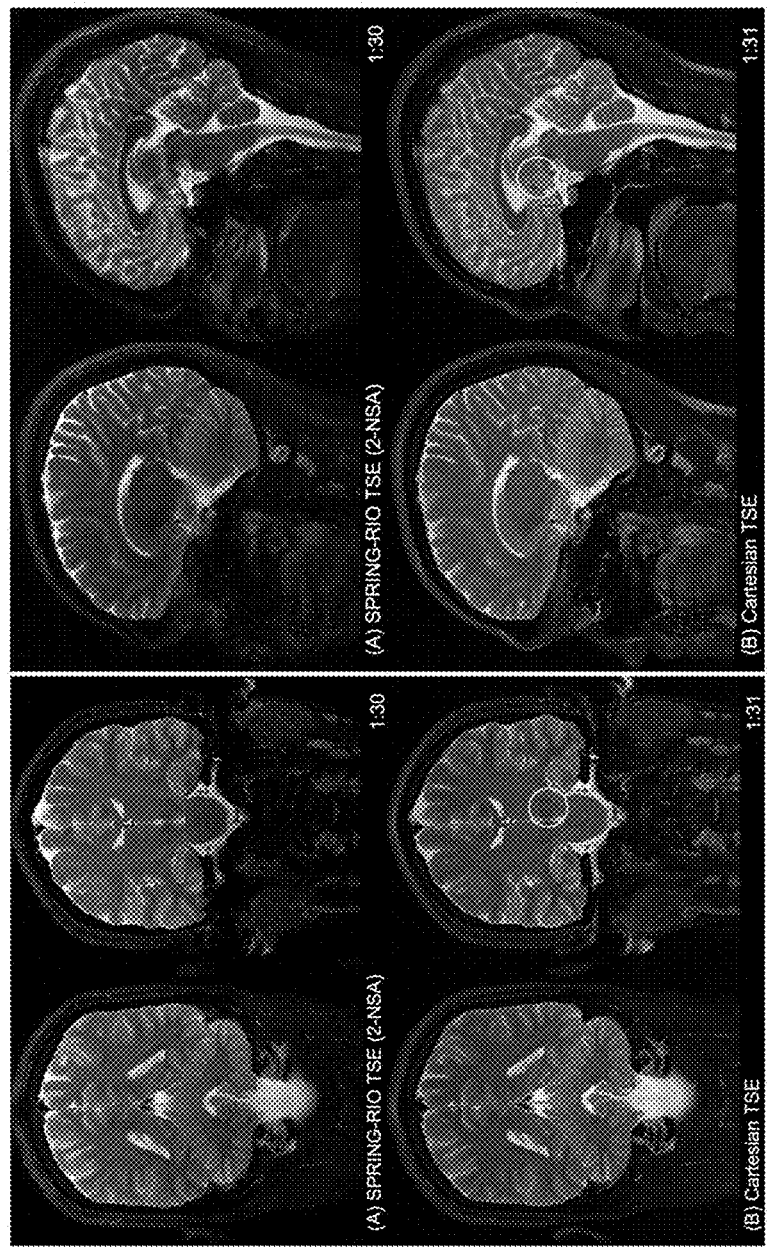
FIG. 13 illustrates a comparison of in-vivo sagittal and coronal images acquired using spiral ring retraced in-out TSE imaging and standard Cartesian TSE imaging.

Referring to FIG. 13, a comparison of in-vivo sagittal and coronal images acquired using spiral ring retraced in-out TSE imaging and standard Cartesian TSE imaging is illustrated. Specifically, corrected images from spiral ring retraced in-out TSE imaging with one signal average (A), spiral ring retraced in-out TSE imaging with two signal averages (B), and standard Cartesian TSE imaging (C) are illustrated in FIG. 13. The red arrows point to the structures where residual signal loss or artifacts exist, likely due to susceptibility or concomitant gradients. The yellow ircles indicate areas where the image contrast is visually better in spiral ring retraced in-out TSE imaging than in Cartesian TSE imaging.

Figure 14:
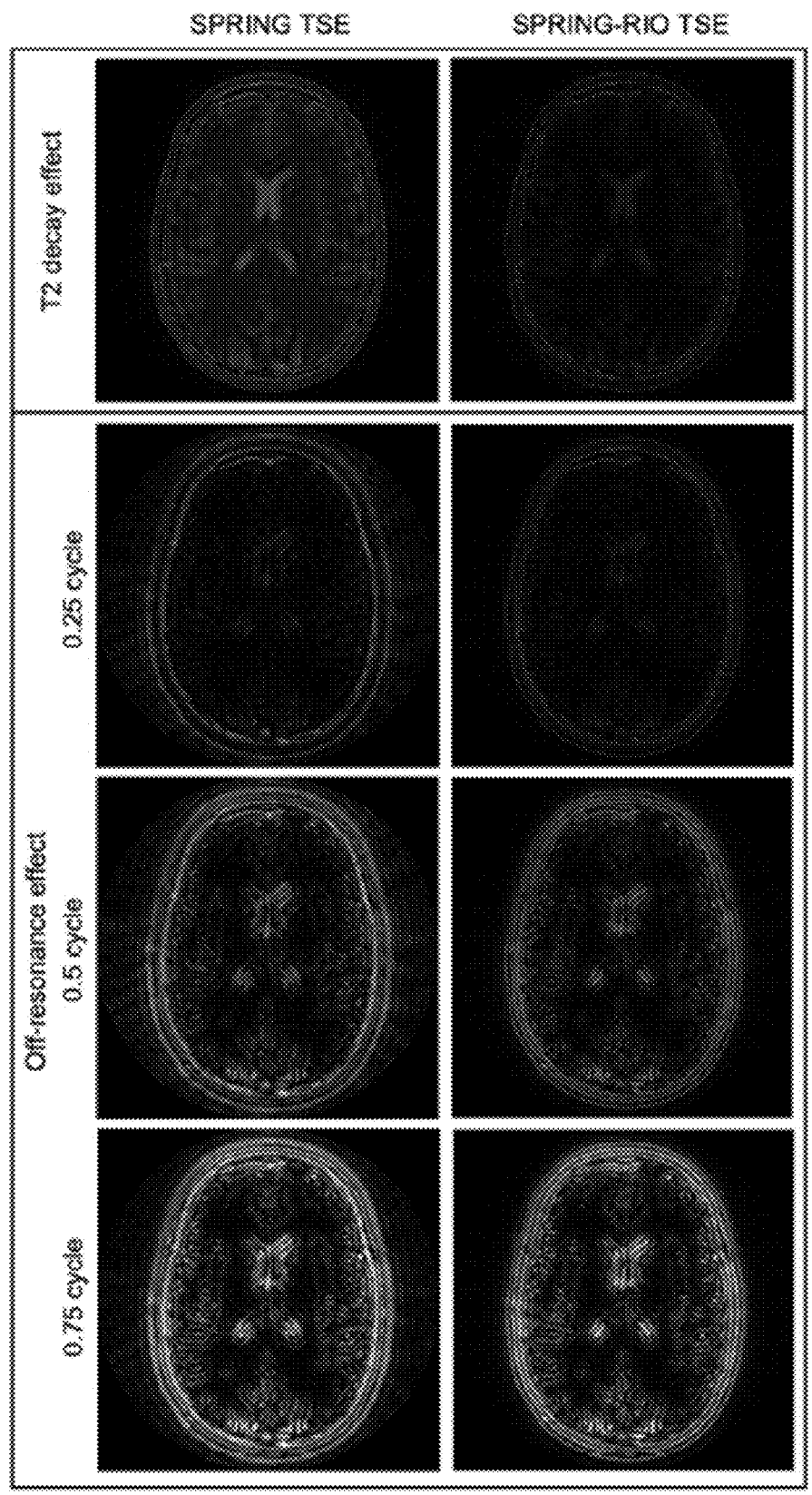
FIG. 14 illustrates a comparison between the T2-decay effect of spiral ring TSE imaging, spiral ring retraced in-out TSE imaging, and a reference image.

Referring to FIG. 14, a comparison between the T2-decay effect of spiral ring TSE imaging, spiral ring retraced in-out TSE imaging, and a reference image is illustrated. Specifically, difference images between the spiral ring TSE imaging (left), spiral ring retraced in-out TSE imaging (right) and the reference are shown. The T2-decay effect with T2=70 ms (top) and off-resonance effect with a constant frequency offset of corresponding to 0.25, 0.5, and 0.75 cycles of phase (bottom) were simulated using a digital brain phantom.

Figure 15:
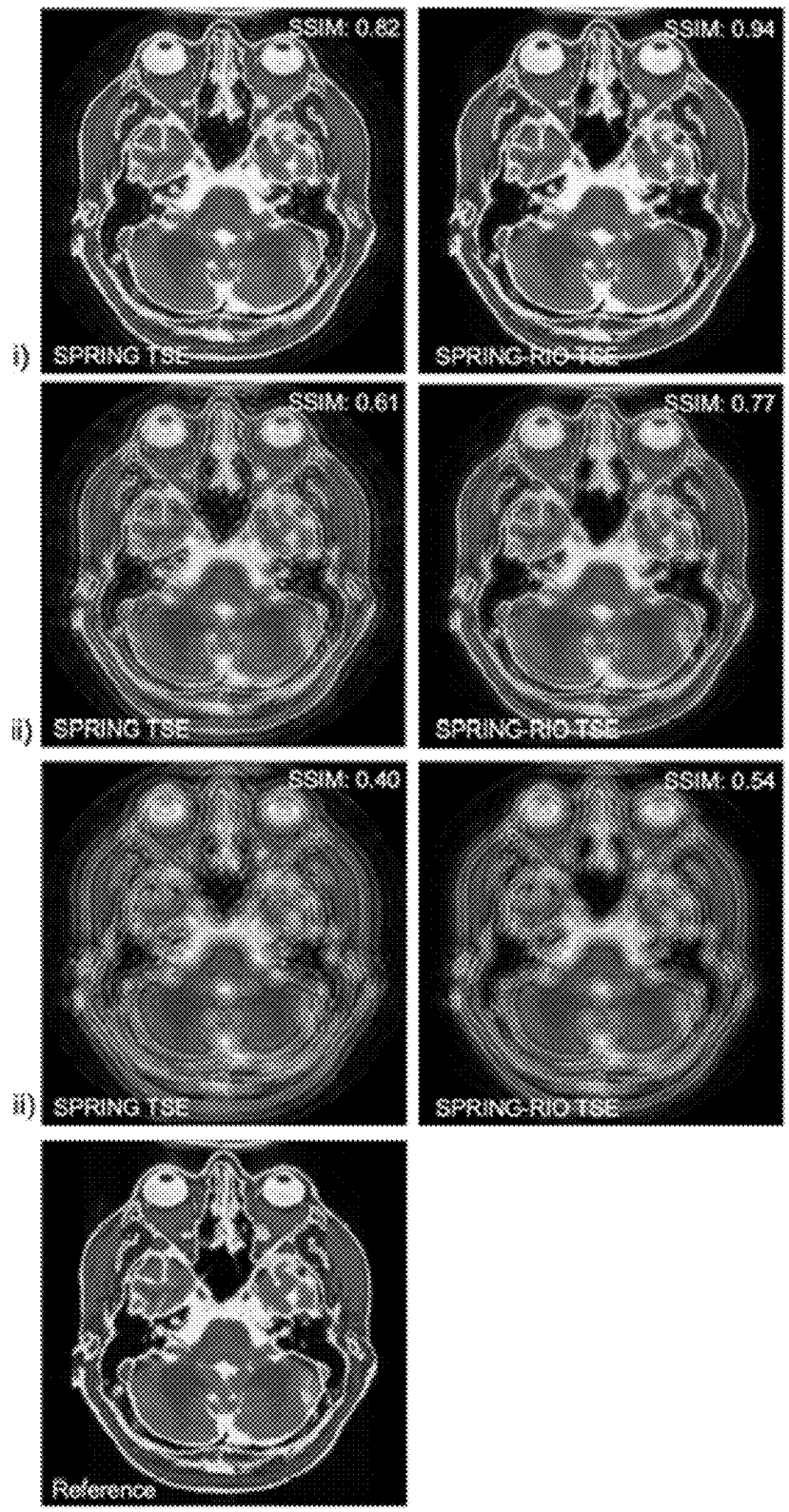
FIG. 15 illustrates simulation results of one inferior slice with air/susceptibility from a digital brain phantom with off-resonance effects for spiral ring TSE imaging and spiral ring retraced in-out TSE imaging.

Referring to FIG. 15, simulation results of one inferior slice with air/susceptibility from a digital brain phantom with off-resonance effects for spiral ring TSE imaging and spiral ring retraced in-out TSE imaging are illustrated. The off-resonance effects were simulated for three different amounts (¼, ½, and ¾ cycles) of phase accumulation in this example. The bottom image with no phase accumulation was used as the reference, and SSIM values were calculated between the reconstructed images of each sequence and the reference. Compared to spiral ring TSE imaging, the artifacts and signal loss in spiral ring retraced in-out TSE imaging are reduced and largely self-corrected when off-resonance is moderate (i and ii).

Figure 16:
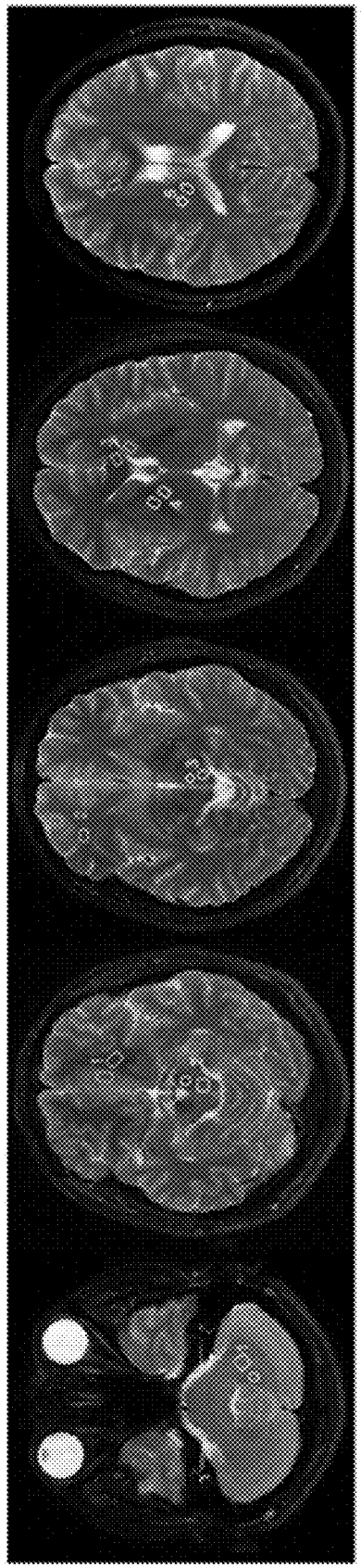
FIG. 16 illustrates measured contrast between regions of interest for spiral ring TSE imaging, spiral ring retraced in-out TSE imaging, and standard Cartesian TSE imaging.

Referring to FIG. 16, measured contrast between regions of interest for spiral ring TSE imaging, spiral ring retraced in-out TSE imaging, and standard Cartesian TSE imaging is illustrated. The first five groups (yellow regions 1~5) measure the contrast between the areas with iron deposition and the surrounding tissue. The next four groups (blue regions 1~4) measure the contrast between gray and white matter in the frontal lobe.

As described and illustrated by way of the examples herein, the spiral ring retraced in-out pulse sequence trajectory of this technology efficiently suppresses T2-decay effects. With trajectory-fidelity and off-resonance corrections, this technology advantageously provides an improvement over Cartesian TSE imaging for T2-weighted MRI, with shorter scan time, higher scan efficiency, lower SAR, and improved image contrast.

It should be appreciated that any number or type of computer-based medical imaging systems or components, including various types of commercially available medical imaging systems and components, may be used to practice certain aspects of the disclosed technology. Systems as described herein with respect to example embodiments are not intended to be specifically limited to MRI implementations or the particular system shown in FIG. 1A-B.

Although example examples of this technology are explained in some instances in detail herein, it is to be understood that other examples are contemplated. Accordingly, it is not intended that the present disclosure be limited in its scope to the details of construction and arrangement of components set forth in the foregoing description or illustrated in the drawings. The present disclosure is capable of other embodiments and of being practiced or carried out in various ways.

It should be appreciated that any of the components or modules referred to with regards to any of the examples discussed herein, may be integrally or separately formed with one another. Further, redundant functions or structures of the components or modules may be implemented. Moreover, the various examples may be communicated locally and/or remotely with any user/clinician/patient or machine/system/computer/processor. Moreover, the various components may be in communication via wireless and/or hardwire or other desirable and available communication means, systems and hardware. Moreover, various components and modules may be substituted with other modules or components that provide similar functions.

It should be appreciated that the devices and related components discussed herein may take on all shapes along the entire continual geometric spectrum of manipulation of x, y and z planes to provide and meet the anatomical, environmental, and/or structural demands and operational requirements. Moreover, locations and alignments of the various components may vary as desired or required. It should also be appreciated that various sizes, dimensions, contours, rigidity, shapes, flexibility and materials of any of the components or portions of components in the various embodiments discussed throughout may be varied and utilized as desired or required. Additionally, it should be appreciated that while some dimensions are provided on the aforementioned figures, any of the device may constitute various sizes, dimensions, contours, rigidity, shapes, flexibility and materials as it pertains to the components or portions of components of the device, and therefore may be varied and utilized as desired or required.

In describing the examples herein, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

As discussed herein, a "subject" may be any applicable human, animal, or other organism, living or dead, or other biological or molecular structure or chemical environment, and may relate to particular components of the subject, for instance specific tissues or fluids of a subject (e.g., human tissue in a particular area of the body of a living subject), which may be in a particular location of the subject, referred to herein as an "area of interest" or a "region of interest." It should be appreciated that an animal may be a variety of any applicable type, including, but not limited thereto, mammal, veterinarian animal, livestock animal or pet type animal, etc. As an example, the animal may be a laboratory animal specifically selected to have certain characteristics similar to human (e.g. rat, dog, pig, monkey), etc. It should be appreciated that the subject may be any applicable human patient, for example.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g. 1 to 5 includes 1, 1.5, 2, 2.75, 3, 3.90, 4, 4.24, and 5). Similarly, numerical ranges recited herein by endpoints include subranges subsumed within that range (e.g. 1 to 5 includes 1-1.5, 1.5-2, 2-2.75, 2.75-3, 3-3.90, 3.90-4, 4-4.24, 4.24-5, 2-5, 3-5, 1-4, and 2-4). It is also to be understood that all numbers and fractions thereof are presumed to be modified by the term "about."

Having thus described the basic concepts of the disclosed technology, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A method for turbo spiral echo (TSE) imaging of a subject, the method implemented by one or more computing devices and comprising:
    generating a TSE pulse sequence comprising a series of radio frequency (RF) refocusing pulses to produce a corresponding series of nuclear magnetic resonance (NMR) spin echo signals;
    generating a gradient waveform comprising a first plurality of segments collectively comprising a spiral ring retraced in-out trajectory;
    generating during an interval adjacent to each of the series of RF refocusing pulses a first gradient pulse according to the gradient waveform, wherein the first gradient pulses encode the NMR spin echo signals; and
    constructing an image from digitized samples of the NMR spin echo signals obtained based at least in part on the encoding.

2. The method of claim 1, wherein the first gradient pulses encode the NMR spin echo signals in a first gradient axis.

3. The method of claim 2, further comprising generating during the interval adjacent to each of the series of RF refocusing pulses a second gradient pulse according to the gradient waveform, wherein the second gradient pulses encode the NMR spin echo signals in a second gradient axis different from the first gradient axis.

4. The method of claim 1, wherein one of the first plurality of segments comprises self-retraced in-out rings, the self-retraced in-out rings are preceded by one or more spiral-in rings of the first plurality of segments, and the self-retraced in-out rings are followed by one or more spiral-out rings of the first plurality of segments.

5. The method of claim 4, wherein a first one of the one or more spiral-out rings comprises a field map and the method further comprises using a semiautomatic deblurring based on the field map to construct the image.

6. The method of claim 1, further comprising:
    generating a RF excitation pulse to produce transverse magnetization that generates a NMR signal; and
    constructing the image further based on a slice select gradient pulse generated concurrently with each of the RF refocusing pulses.

7. The method of claim 1, further comprising:
    inverting a gradient polarity of a first copy of a first one of a second plurality of segments of equal time duration split from a spiral-out ring;
    inserting a time-reversed version of the first copy in front of the first one of the second plurality of segments to generate a self-retraced in-out ring;

inserting the remaining ones of the second plurality of segments consecutively at a first plurality of TSE echoes following the effective echo time to generate one or more spiral-out rings;

inverting another gradient polarity of a second copy of each of the remaining ones of the second plurality of segments; and inserting the second copies consecutively in reverse order at a second plurality of TSE echoes preceding the effective echo time to generate one or more spiral-in rings.

8. The method of claim 7, further comprising rotating a plurality of times the self-retraced in-out rings, the one or more spiral-out rings, and the one or more annular spiral-in rings to generate the first plurality of segments of the gradient waveform.

9. A computing device, comprising memory comprising programmed instructions stored thereon and one or more processors configured to execute the stored programmed instructions to:

produce a turbo spiral echo (TSE) pulse sequence to generate a corresponding series of nuclear magnetic resonance (NMR) spin echo signals, wherein the TSE pulse sequence comprises a series of radio frequency (RF) refocusing pulses;

generate first and second gradient waveforms each comprising a first plurality of segments collectively comprising a spiral ring retraced in-out trajectory;

generate during an interval adjacent to each of the series of RF refocusing pulses a pair of gradient pulses each according to one of the first or second gradient waveforms, wherein the pair of gradient pulses provides an encoding of the NMR spin echo signals; and construct an image from digitized samples of the NMR spin echo signals obtained based in part on the encoding.

10. The computing device of claim 9, wherein a first one of the pair of gradient pulses encode the NMR spin echo signals in a first gradient axis and a second one of the pair of gradient pulses encodes the NMR spin echo signals in a second gradient axis.

11. The computing device of claim 9, wherein one of the first plurality of segments comprises self-retraced in-out rings, the self-retraced in-out rings are preceded by one or more spiral-in rings of the first plurality of segments, and the self-retraced in-out rings are followed by one or more spiral-out rings of the first plurality of segments.

12. The computing device of claim 11, wherein a first one of the one or more spiral-out rings comprises a field map and the one or more processors are further configured to execute the stored programmed instructions to use a semiautomatic deblurring based on the field map to construct the image.

13. The computing device of claim 9, wherein the one or more processors are further configured to execute the stored programmed instructions to:

generate a RF excitation pulse to produce transverse magnetization that generates a NMR signal; and construct the image further based on a slice select gradient pulse generated concurrently with each of the RF refocusing pulses.

14. The computing device of claim 9, wherein the one or more processors are further configured to execute the stored programmed instructions to instruct a control sequencer to communicate with:

a magnetic resonance imaging (MRI) subsystem of an MRI system to produce the TSE pulse sequence; and a gradient subsystem of the MRI system to generate the pair of gradient pulses.

15. The computing device of claim 9, wherein the one or more processors are further configured to execute the stored programmed instructions to:

invert a gradient polarity of a first copy of a first one of a second plurality of segments of equal time duration split from a spiral-out ring;

insert a time-reversed version of the first copy in front of the first one of the second plurality of segments to generate a self-retraced in-out ring;

insert the remaining ones of the second plurality of segments consecutively at a first plurality of TSE echoes following the effective echo time to generate one or more spiral-out rings;

invert another gradient polarity of a second copy of each of the remaining ones of the second plurality of segments; and insert the second copies consecutively in reverse order at a second plurality of TSE echoes preceding the effective echo time to generate one or more spiral-in rings.

16. The computing device of claim 15, wherein the one or more processors are further configured to execute the stored programmed instructions to rotate a plurality of times the self-retraced in-out rings, the one or more spiral-out rings, and the one or more spiral-in rings to generate the first plurality of segments of the gradient waveform.

17. A magnetic resonance imaging (MRI) system, comprising:

a control sequencer coupled to a gradient subsystem comprising gradient amplifiers and gradient coils and an MRI subsystem comprising a static z-axis magnet and one or more radio frequency (RF) coils; and a data acquisition and display (DADC) device comprising memory comprising programmed instructions stored thereon and one or more processors configured to execute the stored programmed instructions to:

generate first and second gradient waveforms each comprising a plurality of segments collectively comprising a spiral ring retraced in-out trajectory;

instruct the control sequencer to communicate with the:

MRI subsystem to produce a turbo spiral echo (TSE) pulse sequence to generate a corresponding series of nuclear magnetic resonance (NMR) spin echo signals, wherein the TSE pulse sequence comprises a series of RF refocusing pulses; and gradient subsystem to generate during an interval adjacent to each of the series of RF refocusing pulses a pair of gradient pulses each according to one of the first or second gradient waveforms; and construct an image from digitized samples of the NMR spin echo signals.

18. The MRI system of claim 17, wherein a first one of the pair of gradient pulses encode the NMR spin echo signals in a first gradient axis, a second one of the pair of gradient pulses encodes the NMR spin echo signals in a second gradient axis, and the one or more processors are further configured to execute the stored programmed instructions to construct the image based at least in part on the encoding of the NMR spin echo signals in the first and second gradient axes.

19. The MRI system of claim 17, wherein one of the plurality of segments comprises self-retraced in-out rings, the self-retraced in-out rings are preceded by one or more spiral-in rings of the plurality of segments, and the self-retraced in-out rings are followed by one or more spiral-out rings of the plurality of segments.

20. The MRI system of claim 19, wherein a first one of the spiral-out rings comprises a field map and the one or more processors are further configured to execute the stored programmed instructions to use a semiautomatic deblurring based on the field map to construct the image.

\* \* \* \* \*